(12) United States Patent
McCall et al.

(10) Patent No.: US 6,674,648 B2
(45) Date of Patent: Jan. 6, 2004

(54) TERMINATION CARDS AND SYSTEMS THEREFORE

(75) Inventors: James A. McCall, Beaverton, OR (US); Bryce D. Horine, Beaverton, OR (US); Hing Thomas Y. To, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/911,754

(22) Filed: Jul. 23, 2001

(65) Prior Publication Data

US 2003/0016516 A1 Jan. 23, 2003

(51) Int. Cl.[7] .................................................. H05K 7/06
(52) U.S. Cl. ...................... 361/788; 361/760; 361/777; 361/782; 361/786; 361/803; 174/261
(58) Field of Search ........................ 361/760, 782–786, 361/790, 803, 777, 788; 365/51, 52, 63, 185.09; 710/301, 302; 326/30; 257/664, 728, 723, 724; 174/261

(56) References Cited

U.S. PATENT DOCUMENTS

| | | |
|---|---|---|
| 3,992,686 A | 11/1976 | Canning |
| 4,862,161 A | 8/1989 | Schomers |
| 5,467,455 A | 11/1995 | Gay et al. |
| 5,495,435 A | 2/1996 | Sugahara |
| 5,530,623 A | 6/1996 | Sanwo et al. |
| 5,598,408 A | 1/1997 | Nickolls et al. |
| 5,638,402 A | 6/1997 | Osaka et al. |
| 5,680,555 A | 10/1997 | Bodo et al. |
| 5,706,447 A | 1/1998 | Vivio |
| 5,734,208 A | 3/1998 | Jones |
| 5,919,252 A | 7/1999 | Klein |
| 6,067,594 A | 5/2000 | Perino et al. |
| 6,075,704 A | 6/2000 | Amberg et al. |
| 6,081,430 A | 6/2000 | La Rue |
| 6,104,629 A | 8/2000 | Wu |
| 6,108,740 A | 8/2000 | Caldwell |
| 6,109,929 A * | 8/2000 | Jasper ........................ 439/74 |
| 6,115,278 A | 9/2000 | Deneroff et al. |
| 6,122,695 A | 9/2000 | Cronin |
| 6,128,685 A | 10/2000 | Cronin |
| 6,249,832 B1 | 6/2001 | Sanders et al. |
| 6,262,940 B1 | 7/2001 | Choi et al. |
| 6,266,252 B1 | 7/2001 | Karabatsos |
| 6,266,730 B1 | 7/2001 | Perino et al. |
| 6,308,232 B1 | 10/2001 | Gasbarro |
| 6,144,576 A1 | 11/2001 | Leddige et al. |
| 6,317,352 B1 | 11/2001 | Halbert et al. |
| 6,328,572 B1 * | 12/2001 | Higashida et al. ............ 439/61 |
| 6,349,050 B1 | 2/2002 | Woo et al. |
| 6,353,539 B1 | 3/2002 | Horine et al. |
| 6,376,904 B1 * | 4/2002 | Haba et al. .................. 257/686 |
| 6,381,164 B1 | 4/2002 | Fan et al. |
| 6,404,660 B1 | 6/2002 | Gamini et al. |
| 6,438,012 B1 | 8/2002 | Osaka et al. |
| 6,496,445 B2 | 12/2002 | Lee |

FOREIGN PATENT DOCUMENTS

WO    WO 00/28661    5/2000

OTHER PUBLICATIONS

A. Becker, "Reports on the death of MCMs are premature," Portable Design, May 2001, pp. 18 and 20.

* cited by examiner

Primary Examiner—David L. Talbott
Assistant Examiner—John B. Vigushin
(74) Attorney, Agent, or Firm—Alan K. Aldous

(57) ABSTRACT

In some embodiments, the invention includes a termination card having a substrate having groups of fingers on a first side of the substrate and groups of fingers on a second side of the substrate and wherein some of the groups of fingers on the first side and some of the groups of fingers on the second side are connected through module connectors, and others of the groups of fingers on the first side are coupled to on module terminations on the first side.

24 Claims, 26 Drawing Sheets

US 6,674,648 B2

TERMINATION CARDS AND SYSTEMS THEREFORE

BACKGROUND OF THE INVENTION

1. Technical Field of the Invention

The present inventions relate to semiconductor chip modules and, more particularly, to layouts for paths for circuit boards and modules.

2. Background Art

Modules include circuit boards, such as printed circuit boards (PCBs), that have chips (integrated circuits) on one or both sides of the modules. Examples of memory modules include single in line memory modules (SIMMs) and dual in line memory modules (DIMMs). The modules are positioned on motherboards, which may also support a controller, such as a memory controller (which may be integrated with other chipset functions or in a processor).

Traditional bus design, such as that used by current synchronous dynamic random access memories (SDRAMs) and double data rate (DDR) SDRAMs, involves the use of relatively long stubs (called a stubbed bus) as described in the following example in which two modules and a controller are on a motherboard. A bus of conductors extends a portion of the motherboard from the controller to the first and second modules. When the bus is adjacent the first module, relatively long stubs from the bus extend to the first module and to package connections of chips in the module. Likewise, when the bus is adjacent the second module, relatively long stubs from the bus extend to the second module and to package connections of chips in the second module. Package connections are used to interface with the world outside the chip. Examples of package connections include pins and balls (such as for ball grid arrays or flip chip arrangements).

Electrical reflections occur as a result of the stub. Electrical reflections from relatively long stubs tend to slow the maximum rate at which voltage switches may occur. Some systems have been used with very short stubs extending to chips from busses in the modules.

Changes in impedance can cause undesirable reflections. When changes in impedances are necessary, it may be desirable to increase or decrease impedances in steps. In the case in which a conductor splits into two sections, it is often desirable to raise the impedance of the two sections following the split to be about twice that of the section before the split. However, achieving this ratio is not always practical and a lower ratio may be used.

A path typically at least one termination device (called a termination), such as a termination resistor, to allow electrical energy to dissipate. Terminations may be positioned on the device originating the signal (for example, the controller), on the motherboard, on the module, on the die (chip), and/or in the package. Terminations are positioned between the conductor to be terminated and a reference voltage node, for example, having a ground voltage, a power supply voltage, or some other voltage.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

The following detailed description describes multiple inventions which are claimed in different patent applications. The same description is provided in each application. However, the various inventions are not restricted to the details of the figures or written disclosure. Indeed, the inventions may be practiced through details different from those shown in the figures and described herein.

1. Overview: A Simple Example

Figure 1:
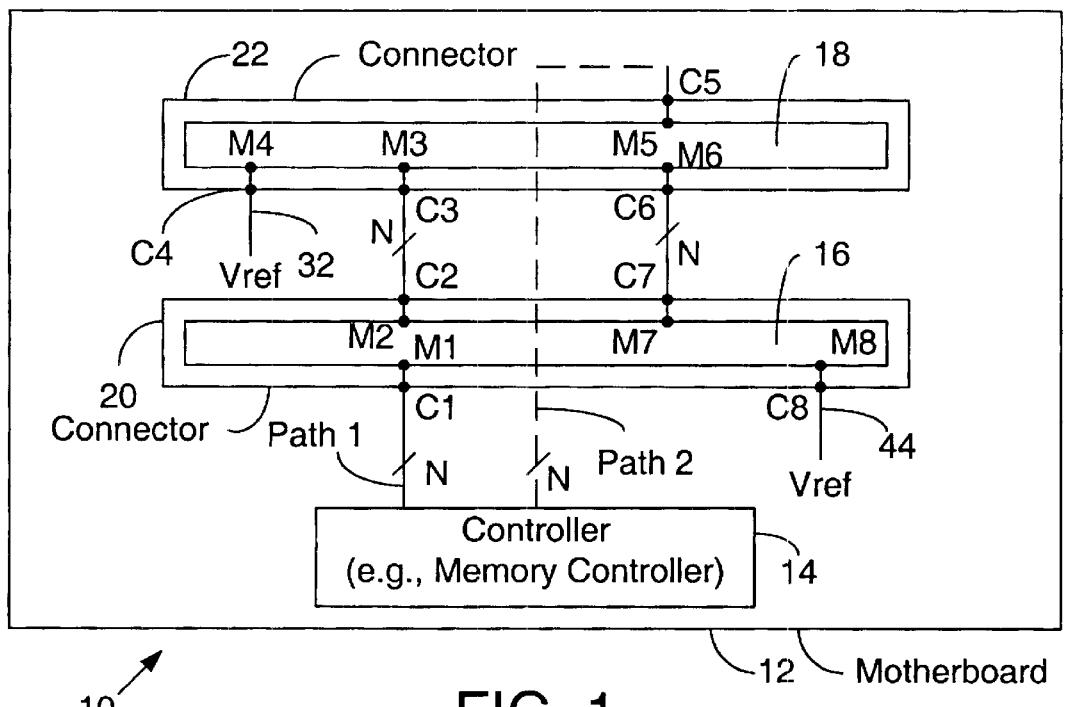
FIG. 1 is a schematic plan view representation of a system including a motherboard, a controller, and two module connectors (not including the modules).

FIGS. 1–10 provide a schematic representation of a relatively simple system illustrating features of the inventions. Note that FIGS. 1–38 are somewhat transparent (schematic) rather than being strictly plan, front, side, or cross-sectional views in that some objects below the surface are sometimes shown. Further, the figures are not intended to show correct relative sizes or shapes of objects in the drawings. FIG. 1 illustrates a system 10 having a motherboard 12. A controller 14 is associated with motherboard 12. Module connectors 20 and 22 are on motherboard 12. Module slots 16 and 18 are formed in module connectors 20 and 22. When modules 1 and 2 are inserted in the connectors, module slots 16 and 18 are filled. In the case in which memory modules are to be inserted in module connectors 20 and 22, controller 14 includes memory controller functions. (The inventions are not restricted to use with memory modules.) Controller 14 may be in a chipset (e.g., a north bridge/hub) or it may be in a processor chip or group of chips or elsewhere.

A connector connection is an electrically conductive interface between a module connector (e.g., module connector 20 in FIG. 1) and a conductor on a path. For example, conductor connections C1 are interfaces between module connector 20 and conductors on path 1. There are N parallel connector connections in C1 and N parallel conductors in path 1. In this disclosure, connector connections are designated with the letter "C" followed by a number (e.g., C1, C2, etc.). Various devices may be used for connector connections including, for example, pin through holes, pads, and balls.

Figure 5:
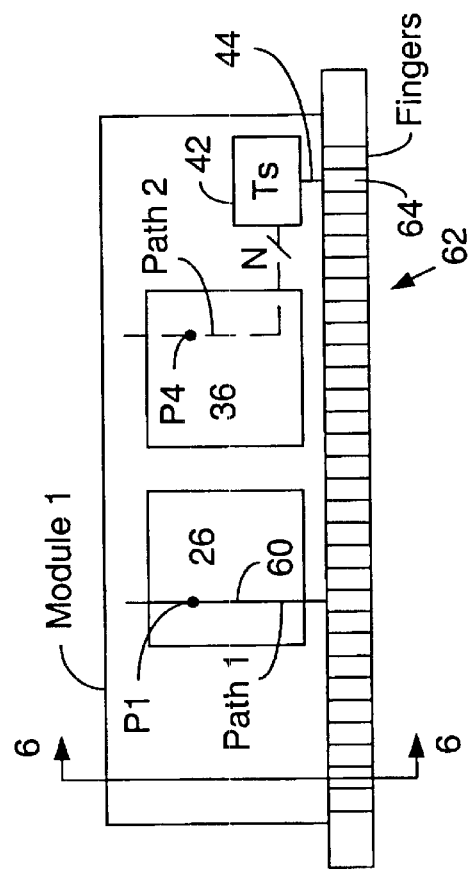
FIG. 5 is a schematic front view representation of a first module of FIG. 2.

Modules typically include fingers, such as fingers 62 in FIG. 5. The fingers interface with connector contacts on the module connectors. The connector contacts are designated with the letter "M" followed by a number (e.g., M1, M2, etc.). "M" is chosen to indicate it interfaces with the module. The connector contact may be a spring or other element. The inventions are not restricted to any particular connector contacts. As an example, in FIG. 5, finger 64 interfaces with a connector contacts M8 which is coupled to conductors 44.

A package connection is an electrical conductive interface between the module and a chip package. In this disclosure, a chip includes a die and a package of some sort connecting the die to the outside world and perhaps also protecting the die. (Note that in common usage, the term chip is sometimes used synonymously with the term die.) There are a variety of ways in which the package connection may occur. Examples of items used in the package connections include pins and balls (such as for ball grid arrays which may be used in flip chip arrangements). Package connections are designated with the letter "P" followed by a number (e.g., P1, P2 etc.).

Routing path 1 and routing path 2 are paths that may be on the surface of and/or inside the motherboard. They may be data paths and may be uni-directional or bi-directional. Path 1 is shown with solid lines and path 2 is shown with dashed lines. Paths 1 and 2 are in an arrangement that may be referred to as a split ring. Clocking and control signals are not illustrated in the simplified FIGS. 1–10. Path 1 extends from controller 14 to connector connections C1 and connector contacts M1 on module connector 20. Note that there are N parallel conductors in path 1. Accordingly, there are N connector connections designated as connector connections C1 and N connector contacts designated as connector contacts M1. The term "extend" does not imply that the path is in a straight line.

Figure 2:
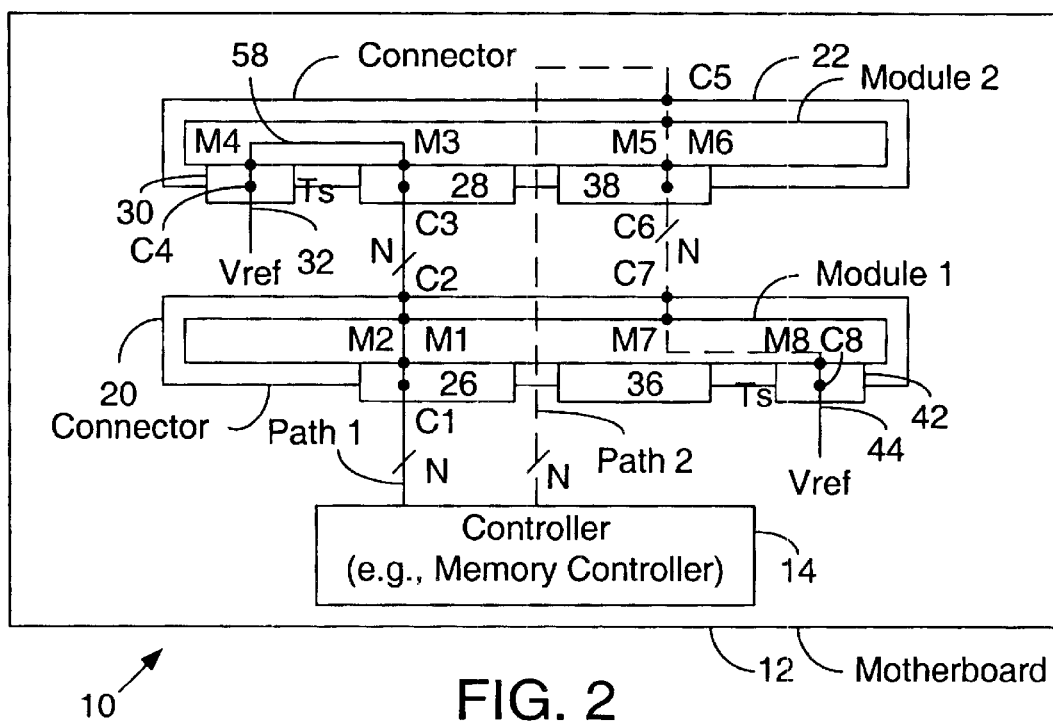
FIG. 2 is a schematic plan view representation of the motherboard of FIG. 1 with the modules inserted in the connectors.

Path 1 continues at connector contacts M2. Note there is a gap between M1 and M2. As shown in FIG. 2, this gap is filled by conductors as shown on module 1 between fingers that interface with M1 and fingers that interface with M2. (In FIGS. 1 and 2, M1 and M2 are on opposite sides of module connector 20, but that is not required. M1 and M2 could be on the same side of module connector 20.) Path 1 continues from M2 to connector connections C2 to connector connections C3 and connector contacts M3. Path 1 continues from a connector contacts M4 to a connector connections C4. Again, there is a gap between M3 and M4 which is filed with conductors on module 2.

Likewise, path 2 (shown in dashed lines) extends from controller 14 to C5 to M5, from M6 to C6 to C7 to M7 and from M8 to C8. As shown in FIG. 2, gaps between M5 and M6 and between M7 and M8 are filled with conductors on modules 1 and module 2 as shown. As with the case of path 1, path 2 includes N parallel conductor lines and C5, C6, and C7 each represent N connector connections. Likewise, M6, M7 and M8 each represent N connector contacts on module connectors 20 and 22.

Figure 10:
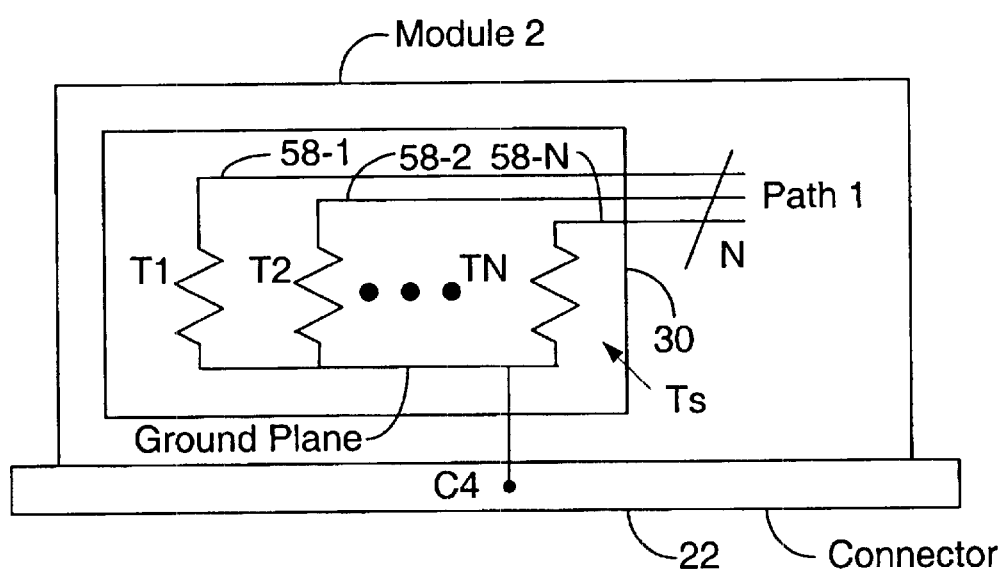
FIG. 10 is a schematic representation of a termination package of FIGS. 2 and 3.

The conductors on Module 2 between M3 and M4 are referred to as conductors 58. With reference to FIGS. 2 and 10, conductors 58 include conductors 58-1, 58-2, . . . 58-N. Termination package 30 includes N terminations T1 T2, . . .

TN (Ts). Terminations Ts are shown as resistors. In practice, they may be one or more transistors, discrete resistors, or other devices.

For high speed signaling, it is often desirable that there a ground conductor associated with every signal conductor on the motherboard, or there is at least one ground conductor for every two signal conductors, although the inventions are not limited to either of these ratios. Referring to FIG. 10, the N conductors 58 each are terminated to a ground plane, although the inventions are not so limited. Conductors (e.g., N or N/2) from the ground plane couple to connector connections C4 (of which there are, for example N or N/2). Conductors 32 (of which there are, for example, N or N/2) are at a reference node Vref, which may be power supply voltage, ground voltage or some other voltage. Termination package 42 and conductors 44 may be similar.

Since the reference lines 32 and 44 are used whether or not there are on module terminations, the on module terminations of termination packages 30 and 42 reduce the number of connector contacts (M) and connector connections (C) by exactly or essentially N for each module for each two paths. In the case of four paths, it would be reduced by exactly or essentially 2N per module. This results in exactly or essentially a ¼ reduction in the number of connector contacts (M), corresponding fingers, and connector connections (C) for the paths (which may be data paths).

Figure 4:
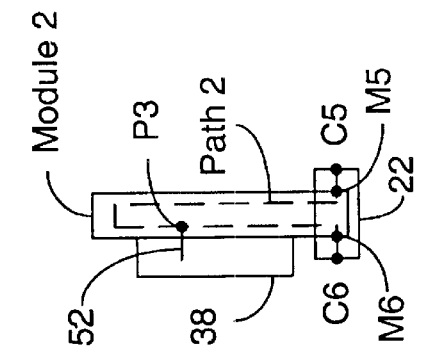
FIG. 4 is a schematic cross-sectional side view representation of a second module of FIG. 3 taken along line 4—4.
Figure 6:
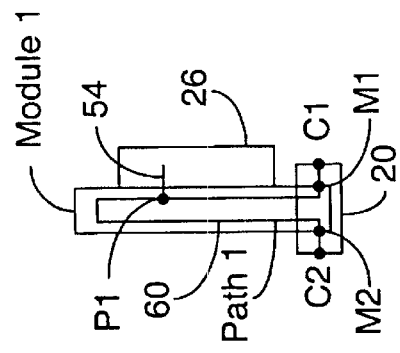
FIG. 6 is a schematic cross-sectional side view representation of a first module of FIG. 5 taken along line 6—6.
Figure 3:
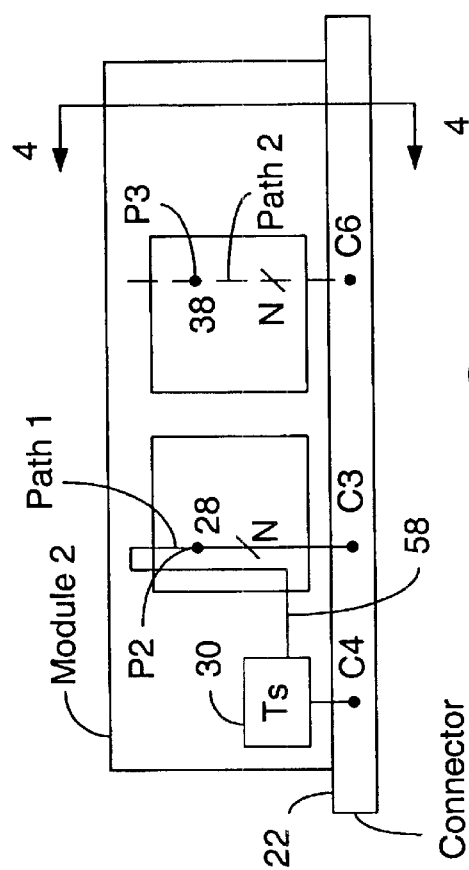
FIG. 3 is a schematic front view representation of a second module of FIG. 2.

FIGS. 3, 4, 5, and 6 provided additional details regarding the illustrated embodiment. Of course, the inventions are not restricted to these details. Package connections P1 and P2 each represent N package connections on path 1 and package connections P3 and P4 each represent N package connections on path 2. In FIGS. 4 and 6, path 1 (called 60 on module 1) and path 2 are slightly set back from chip 26 and 38 respectively. This is not required in practice, but is provided for convenience in making the figures. Very short stubs 54 and 52 protrude from package connections P1 and P3 into chips 26 and 38, respectively. These stubs are extremely short in comparison to the stubs of traditional stubbed busses. Note that in FIG. 3, the path 1 is shown with front and back vertical lines for ease of illustration and understanding. In practice, the lines may be staggered as shown in FIG. 3 or line up one behind the other.

Figure 7:
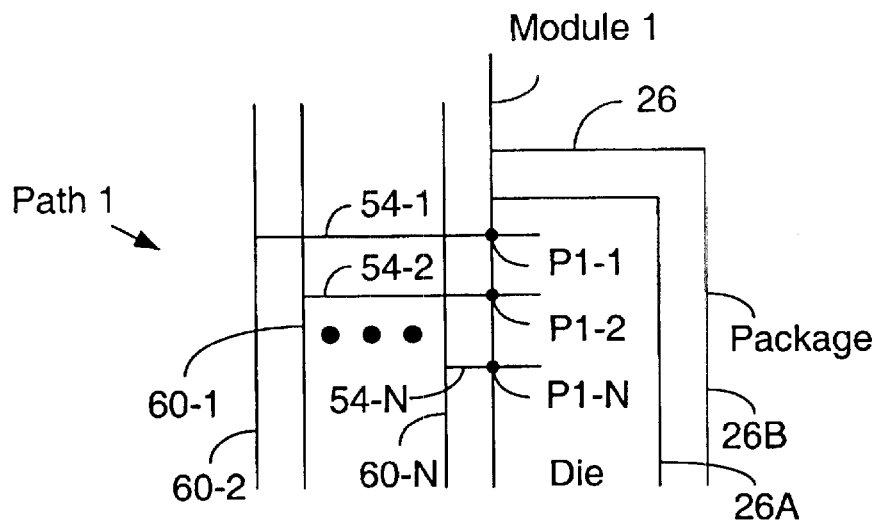
FIG. 7 is a schematic representation showing multiple lines and package connections which are represented by a single line and package connections in FIGS. 1–6.
Figure 8:
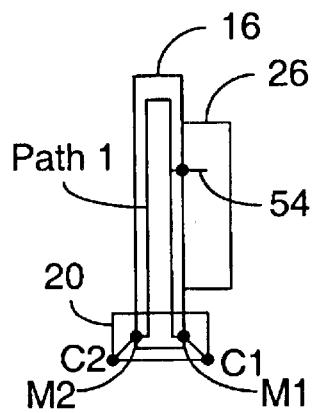
FIG. 8 is a schematic representation of an alternative to FIG. 6.

FIG. 7 illustrates that conductors 60 include N conductors 60-1, 60-2 . . . 60-N. Short stubs 54 include N short stubs 54-1, 54-2 . . . 54-N. Package connections P1 include package connections P1-1, P1-2 . . . P1-N. In FIG. 7, chip 26 includes a die 26A and a package 26B.

Figure 9:
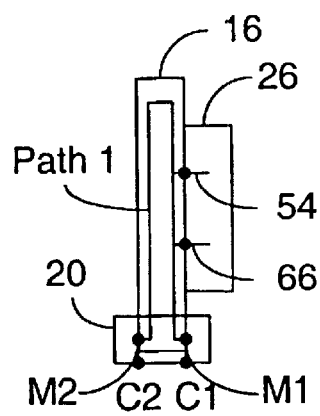
FIG. 9 is a schematic representation of an alternative to FIG. 6.

The position of connector connections C1 and C2 are selected for ease of illustration. In practice, they may be positioned more like that shown in FIG. 8 or 9. Further, as shown in FIG. 9, a chip may have more than one set of package connections and short stubs (54 and 66) per conductor.

2. Examples with Additional Paths

As shown above, by using on module terminations, the number of connector connections, connector contacts, and corresponding fingers on the modules can be reduced by a factor of exactly or essentially ¼. The following examples of FIGS. 11–14 will apply this to a system with more chips. The number of module connections and corresponding fingers is limited by the pitch of the module connections and the length of the connector. In standard computer motherboards, there is a certain amount of space for module connectors. Accordingly, for a given pitch and length, the number of module connections and corresponding fingers is limited. The reduction of ¼ can be useful where connections and fingers are in shortage. The inventions are not limited to these details.

In FIGS. 11–17, bi-directional routing paths 1, 2, 3, 4, 5, 6, 7, and 8 each include N conductors. Connector connections (C), connector contacts (M), and package connections (P) shown in FIGS. 11–17 represent N connector connections, connector contacts, and package connections.

Figure 11:
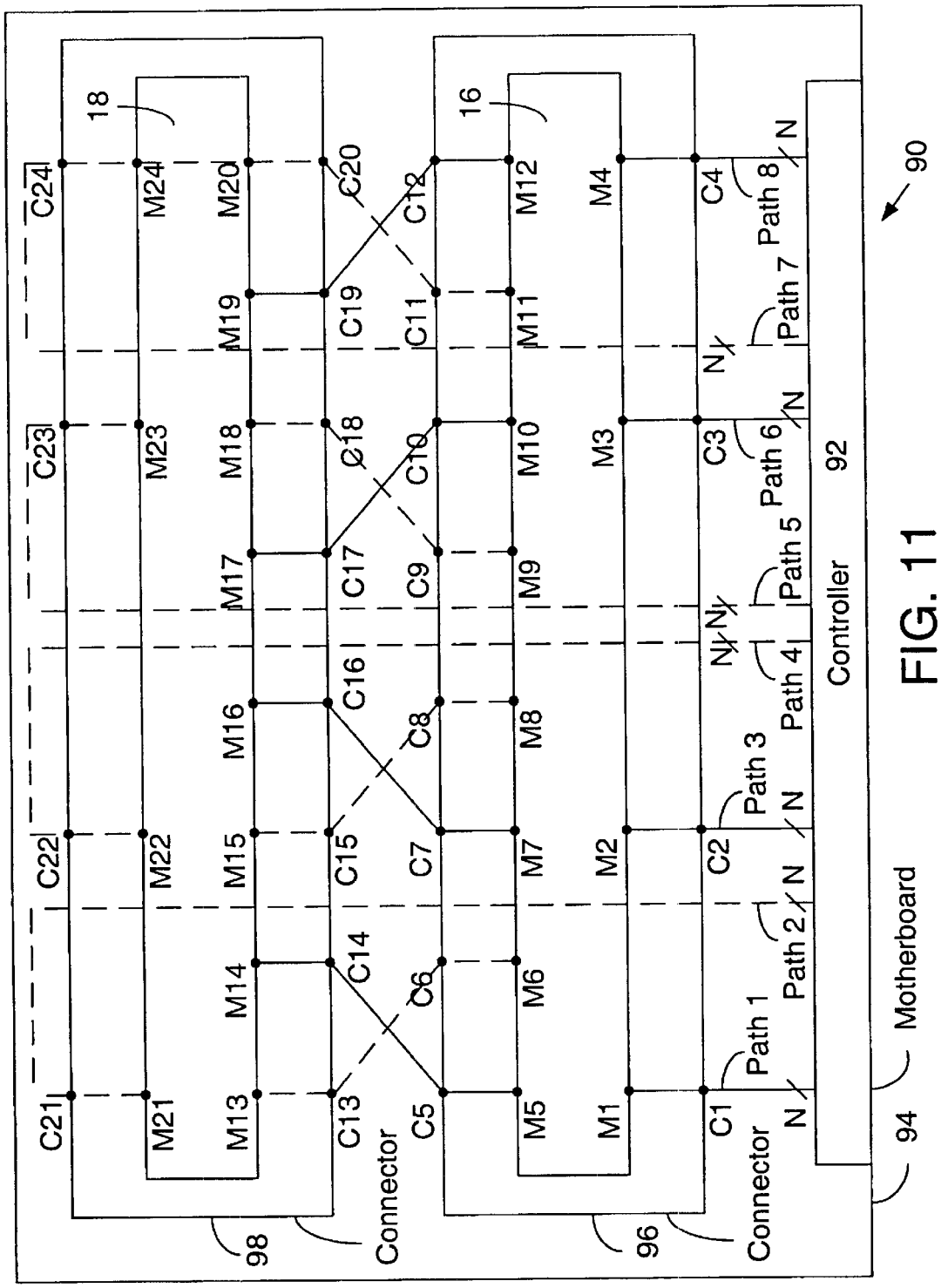
FIG. 11 is a schematic plan view representation of a system including a motherboard, a controller, and two module connectors (not including the modules).
Figure 12:
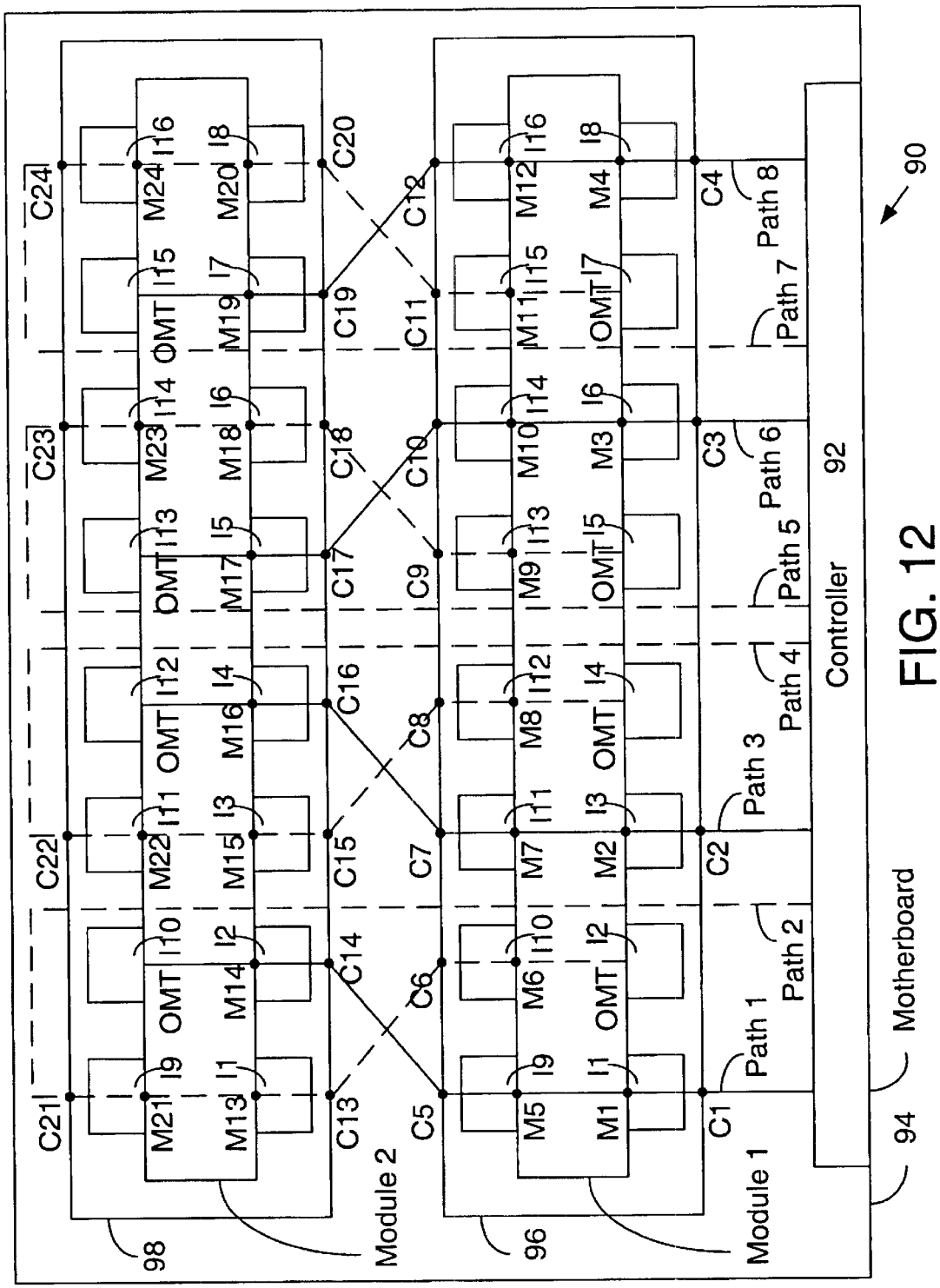
FIG. 12 is a schematic plan view representation of the motherboard of FIG. 11 with the modules inserted in the connectors.

FIG. 11 shows a system 90 without modules 1 and 2 and FIG. 12 shows system 90 with modules 1 and 2. System 90 includes a motherboard 94 and a controller 92. Module connectors 116 and 118 are on motherboard 94 and include each a front side closer to controller 92 and a back side farther from controller 92. Modules 1 and 2 are inserted in module slots 16 and 18 in connectors 116 and 118, respectively. Module 1 includes one set of chips I1, I2 . . . I16 and module 2 includes another set of chips I1, I2 . . . I16. Paths 1, 3, 6, and 8 are shown in solid lines and paths 2, 4, 5, and 7 are shown in dashed lines. Path 1 includes conductors from controller 92 to C1 to M1 and from M5 to C5 to C14 and M14. As can be seen by comparing FIGS. 11 and 12, module 1 couples M1 and M5 and module 2 couples M14 and "on module terminations" (OMT), which are terminations for path 1. Note that the OMT may be similar to or somewhat different from that of FIG. 10.

Path 2 includes conductors from controller 92 to C21 to M21 and from M13 to C13 to C6 and M6. As can be seen by comparing FIGS. 11 and 12, module 2 couples between M21 and M13 and module 1 couples M6 and an OMT, which are terminations for path 2. The route of paths 3, 4 . . . 8 can be seen in FIGS. 11 and 12. The paths may be terminated on a single end (e.g., merely the OMT) or may be terminated on dual ends (in OMT and also in controller 92). The OMTs may be located in a variety of places (e.g., FIGS. 16, 36, and 37).

A problem with the routing of system 90 is that modules 1 and 2 are not interchangeable unless it does not matter if they are rotated 180 degrees. This is because in module 1, the OMTs are coupled to chips 12, 14, 15, and 17, but in module 2, the OMTs are coupled to chips I10, I12, I3, and I15. If for some reason rotation is unobtainable, module 1 must be different than module 2, which causes additional expense. If error correction code (ECC) chips are added to modules 1 and 2, the ECC chips have to be in between chips I4 and I5 and I12 and I13 to keep rotation possible. A disadvantage of having to rotate modules, is that they might be inserted in the wrong orientation. It may be preferred to have the modules and module slots keyed, so the modules cannot be inserted into the module slots in the wrong orientation.

Figure 13:
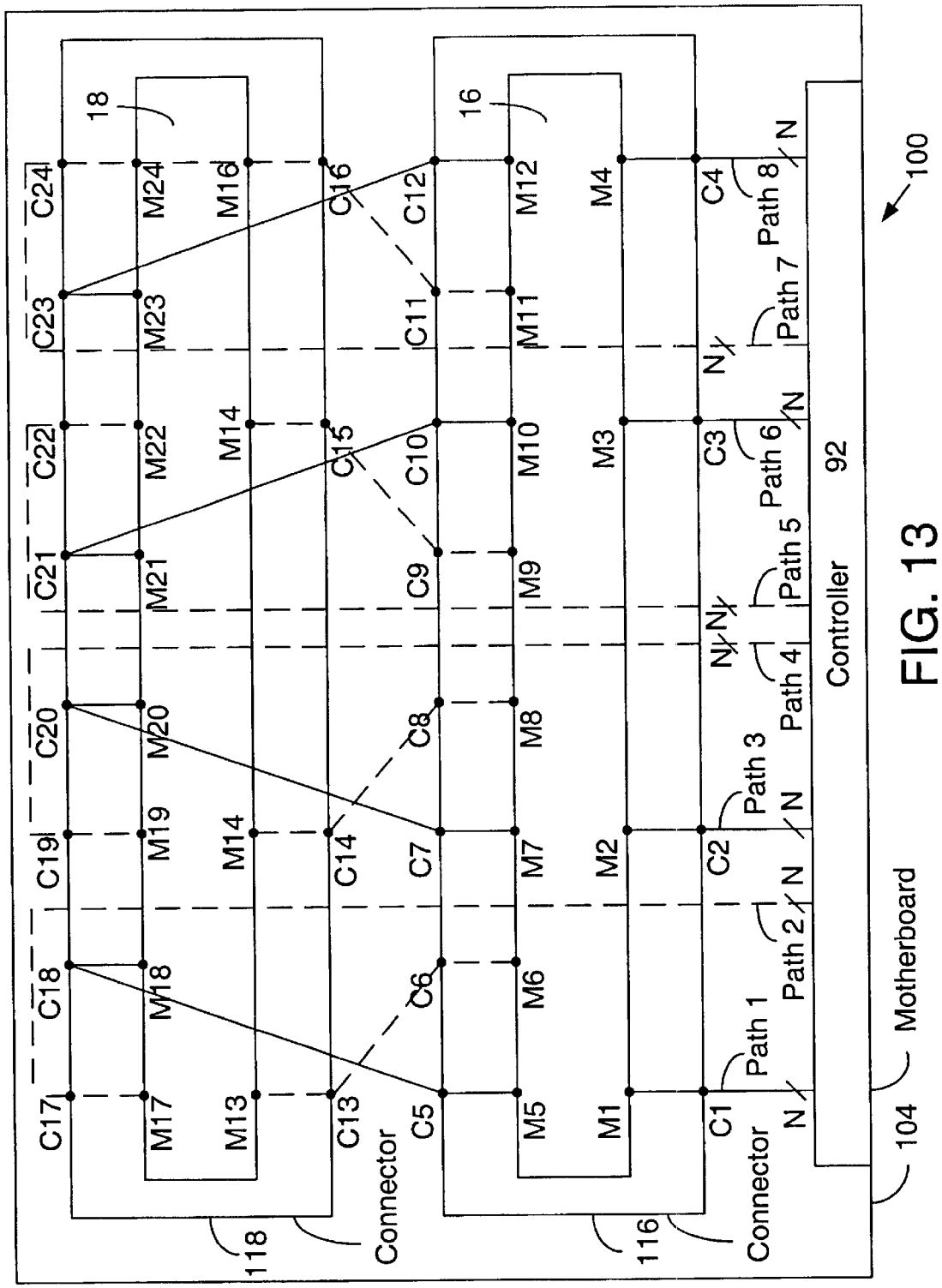
FIG. 13 is a schematic plan view representation of a system including a motherboard, a controller, and two module connectors (not including the modules).
Figure 14:
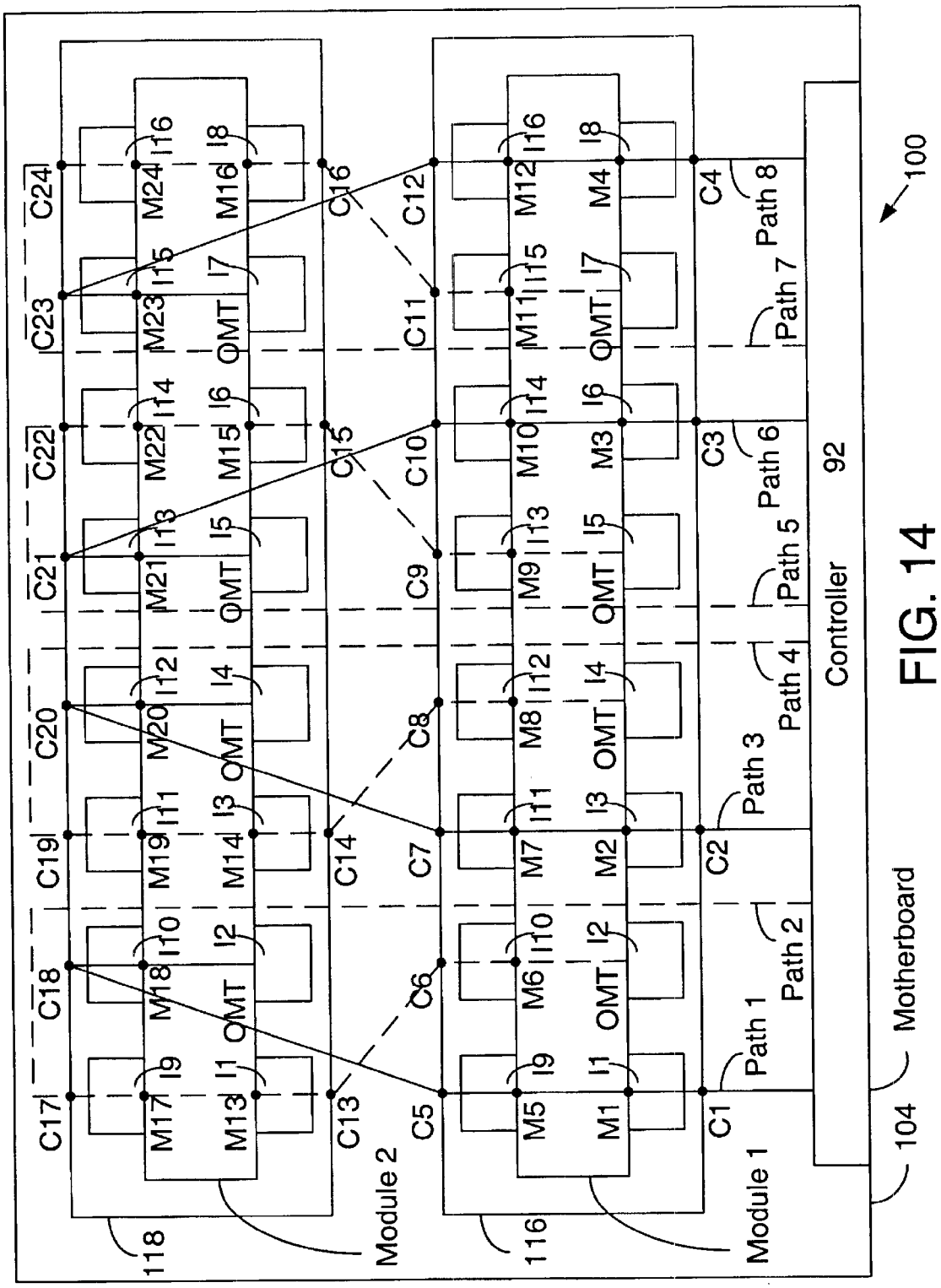
FIG. 14 is a schematic plan view representation of the motherboard of FIG. 13 with the modules inserted in the connectors.

System 100 shown in FIGS. 13 and 14 solves this problem with FIGS. 11 and 12. System 100 is like system 90 except for slightly different routing as shown in the figures and described as follows. In FIGS. 11 and 12, path 1 goes between C5 and C14. By contrast, in FIGS. 13 and 14, path 1 goes between C5 and C18. Similarly, in contrast, in FIGS. 13 and 14, path 3 goes between C7 and C20, path 6 goes between C10 and C21, and path 8 goes between C12 and C23. In comparison with system 90, the routing of system 100 is referred to as a swizzle routing because the points of connector connection swizzles from the front side to the back side of module 2. Note that in system 100, the OMTs are in the same places in module 1 and module 2. Therefore, module 1 could be inserted into slot 18 and module 2 could be inserted into slot 16 and system 100 would perform the same. Modules 1 and 2 and slots 16 and 18 can be keyed so they cannot be rotated. Therefore, in this example, only one type of module needs to be on stock and it cannot be inserted the wrong way.

Note that system 100 provides only one example of a routing in which the OMTs are in the same position. A variety of other routings will provide the same result. For example, through an additional swizzle in module connectors 116 and 118 could cause each OMT to switch from the front to the back side of modules 1 and 2. The relative position of the OMTs could also be changed.

Figure 15:
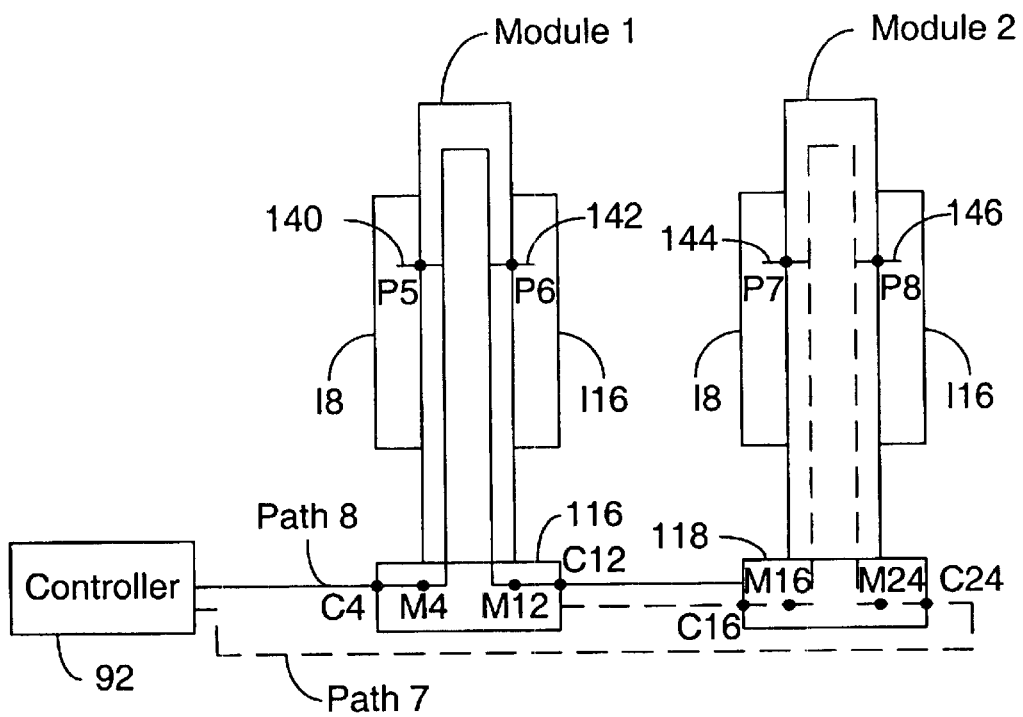
FIG. 15 is a schematic cross sectional side view representation of the system of FIG. 14.

FIG. 15 provides a cross sectional representation of FIG. 14 looking from the right hand side into chips I8 and I16 in modules 1 and 2. Part of path 8 is shown in module 1 and part of path 7 is shown in module 2. Package connections P5 and P6 provide the signal on path 8 to chips I8 and I16 of module 1 through very short stubs 140 and 142. Package connections P7 and P8 provide the signal on path 7 to chips I8 and I16 of module 2 through very short stubs 144 and 146. Note that paths 7 and 8 may be essentially on the surface of modules 1 and 2 or may be under the surface of modules 1 and 2, but are shown inset for convenience in drawing. Paths 8 and 7 do not have to extend as high up into modules 1 and 2 as is shown in FIG. 15. For example, they might extend just to the level of the package connections or above that level. OMTs could have been illustrated in FIG. 15.

Figure 26:
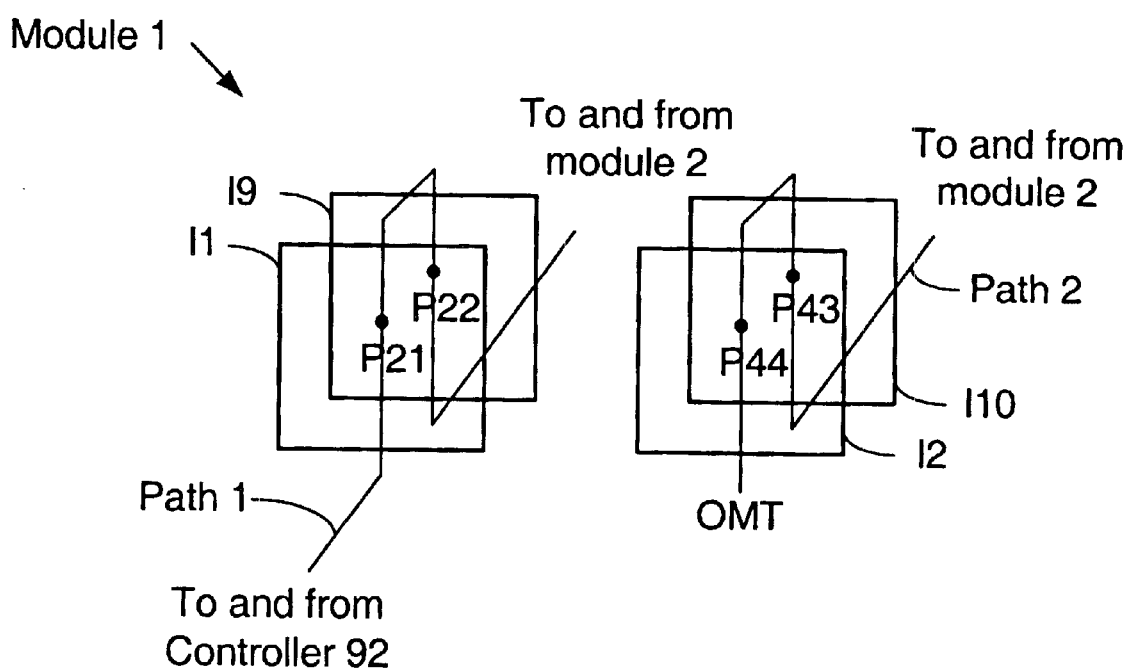
FIG. 26 is a schematic representation of routing paths of the system of FIG. 14.

In the case of chips I7 and I15 in module 1, path 7 has a loop that looks similar to path 8 in FIG. 15 except as follows. In FIG. 15, path 8 is looped between two connector contacts M12 and M4 and is coupled to package connections P5 and P6 between M4 and M12. The loop for path 7 between I7 and I15 does not go between two connector contacts. Rather, in the case of I7 and I15, path 7 has a loop between I7 and I15 that couples package connections for I7 and I15, but it loops between M11 and some interface to the OMT. This may be similar to or different from that shown for path 1 in FIG. 3. The paths in the module each couple to package connections. See FIG. 26 showing portions of routings for path 1 and path 2.

Figure 16:
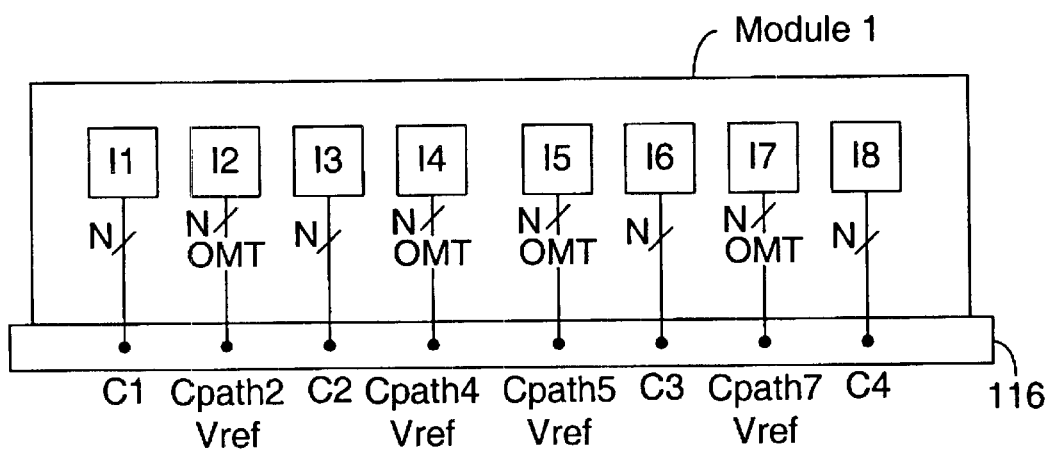
FIG. 16 is a schematic front view representation of module 1 of FIG. 14.

FIG. 16 shows a front view of module 1 of FIG. 14. FIG. 16 illustrates OMTs coupled between chips I2, I4, I5, and I7 and connector connections Cpath2 Vref, Cpath4 Vref, Cpath5 Vref, and Cpath7 Vref, respectively. Connector connections Cpath2 Vref, Cpath4 Vref, Cpath5 Vref, and Cpath7 Vref interfaces with connectors that carry references signals (power, ground, or some other voltage depending on the implementation) for the signals on paths 2, 4, 5, and 7, respectively. Merely as an example, there may be a 1:1 or 2:1 ratio of signal to reference conductors. Since connector connections Cpath2 Vref, Cpath4 Vref, Cpath5 Vref, and Cpath7 Vref are used whether or not there is OMTs, there is a substantial savings (e.g. ¼) in fingers, connector contacts etc. (Compare discussion for FIG. 10.)

Figure 17:
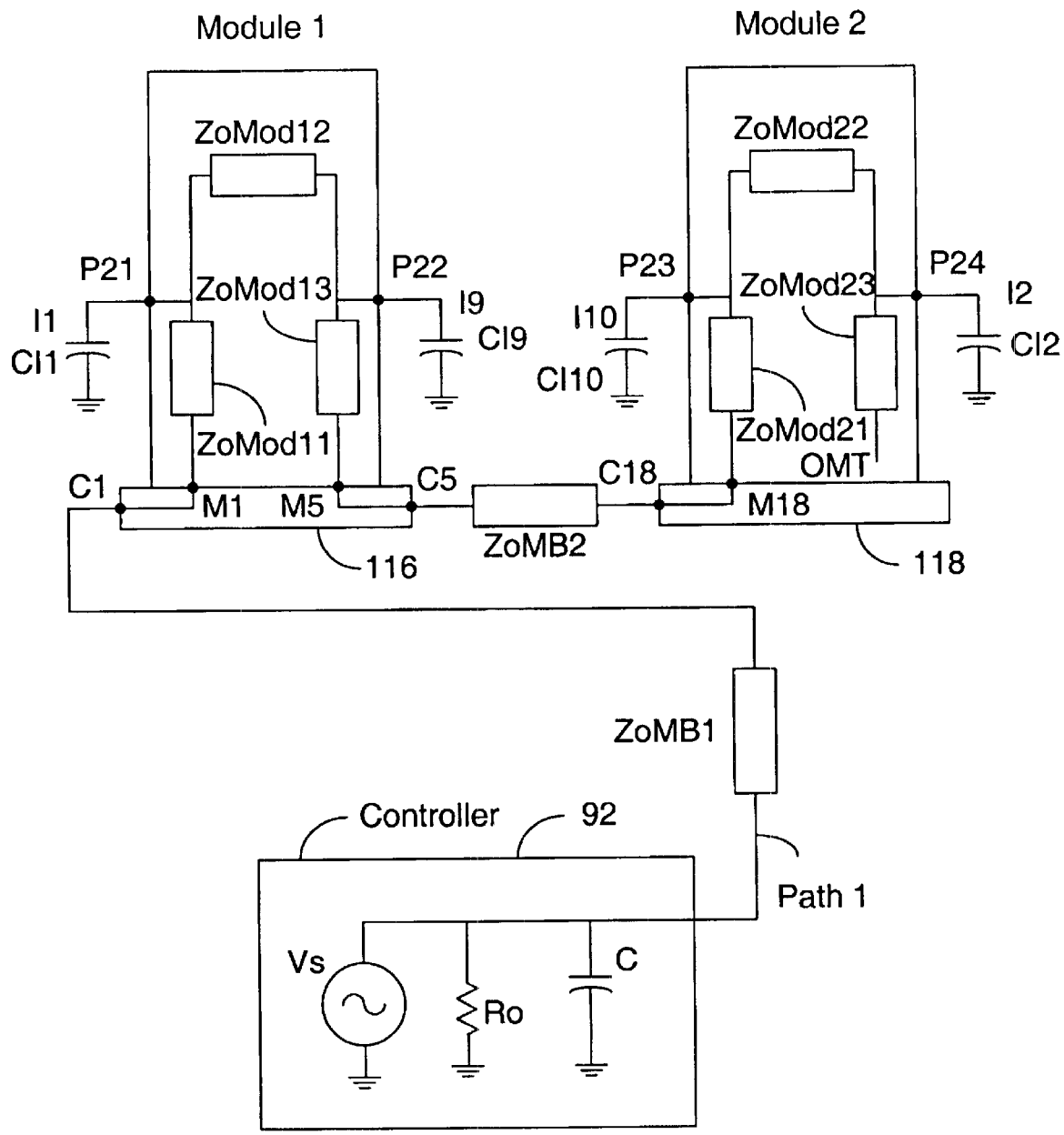
FIG. 17 is a schematic representation of impedances of the system of FIG. 14.

FIG. 17 provides an electrical impedance diagram for path 1 in FIG. 14. ZoMB1 and ZoMB2 are impedances for the motherboard traces of path 1 in the positions shown. ZoMod11, ZoMod12, and ZoMod13 are impedances in module 1 in the positions shown, and ZoMod21, ZoMod22, and ZoMod23 are impedances in module 2 in the positions shown. (Note there are N of each of these.) CI1 and CI9 represent capacitances for chips I1 and I9 of module 1, and CI10 and CI2 represent capacitances for chips I10 and I2 of module 2. It may be desirable to make the impedance of ZoMB2 equal ZoMB1. It may be desirable to make the effective impedances of the combined CI1, ZoMod11 and ½ of ZoMod12 equal to that of ZoMB1. Likewise, it may be desirable to make the effective impedances of the combined CI9, ½ of ZoMod12, and ZoMod13 equal to that of ZoMB1 and so forth with module 2. To compensate for CI1, the impedance of ZoMod11 and perhaps ZoMod12 may be higher than ZoMB1. Likewise, the other impedances in modules 1 and 2 may be higher to compensate for CI9, CI10, and CI2. It may not be practical to get the impedances exactly equal because of size or other expense constraints. Merely as an example, the impedances ZoMB1 and ZoMB2 might be 39 ohms and the impedances ZoMod11, ZoMod12, and ZoMod13 and ZoMod21, ZoMod22, and ZoMod23 might be 63 ohms. Various other values might be used such as 30 and 60 ohms, 33 and 63 ohms, and 50 and 100 ohms, to mention only some of the possibilities.

In FIG. 17, the impedance may increase as the path gets closer to the chip loads. For example, the impedance ZoMod11 could increase as it gets closer to chip I1. ZoMod11 could be higher than impedance in connector 116. Merely as an example, ZoMod12 could be higher than that of ZoMod11 and ZoMod13.

The paths of systems 90 and 100 and systems described below may be terminated on a single end or both ends (in the chipset as well as on the OMT). The capacitance C illustrated in controller 92 for path 1 may be about 2 pF. However, controller 92 and other controllers shown in the figures are not limited to the details illustrated.

3. Systems Includings ECC Chips and/or Buffer Chips

Figure 18:
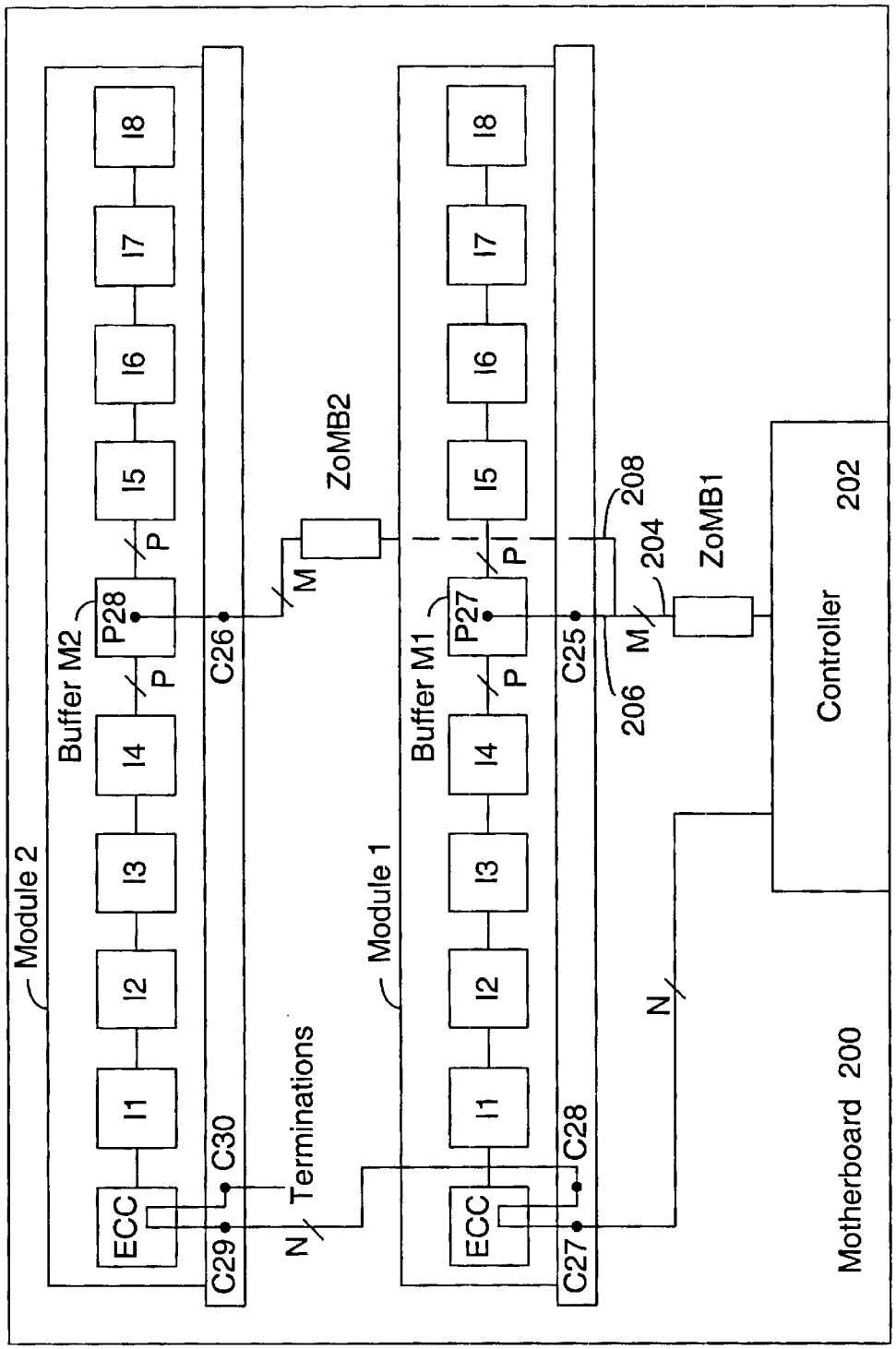
FIG. 18 is a schematic partially plan and partially front view of a system like that of FIG. 14 with the addition of error correction code (ECC) chips and buffer chips included on the modules.

FIG. 18 illustrates a motherboard 200 which may be similar to that of FIG. 14 except that it also includes ECC chips and buffer chips buffer M1 and buffer M2 on modules 1 and 2.

The ECC chips connect through connector connections C27 and C28 and may be of a well known type. The ECC chips may be positioned in different locations from those shown.

The buffer chips buffer M1 and buffer M2 may received address and/or command signals from controller 202 on a path including conductors 204 (which has M conductors). The path splits from conductors 204 to conductors 206 and 208, with conductors 206 coupling to connector connections C25 and conductors 208 coupling to connectors connections C26. Buffers M1 and M2 may in turn provide the address and/or command signals on P conductors to chips I1 –I8 and ECC chips if present. (Of course, the inventions are not restricted to the use of a particular number of chips per module.)

The ECC chips and the buffer chips buffer M1 and buffer M2 may be terminated on the motherboard, on the module, on die, and/or in the controller. (They may be single or dual terminated chips). Rather than terminate at the end of single path after two ECC chips (actually four chips if consider ECC chips on other side of modules are included) as shown in FIG. 18, there could be one path to the ECC chip(s) on module 1 with an OMT on module 1 and another path to the ECC chip(s) on module 2 with an OMT on module 2.

Figure 19:
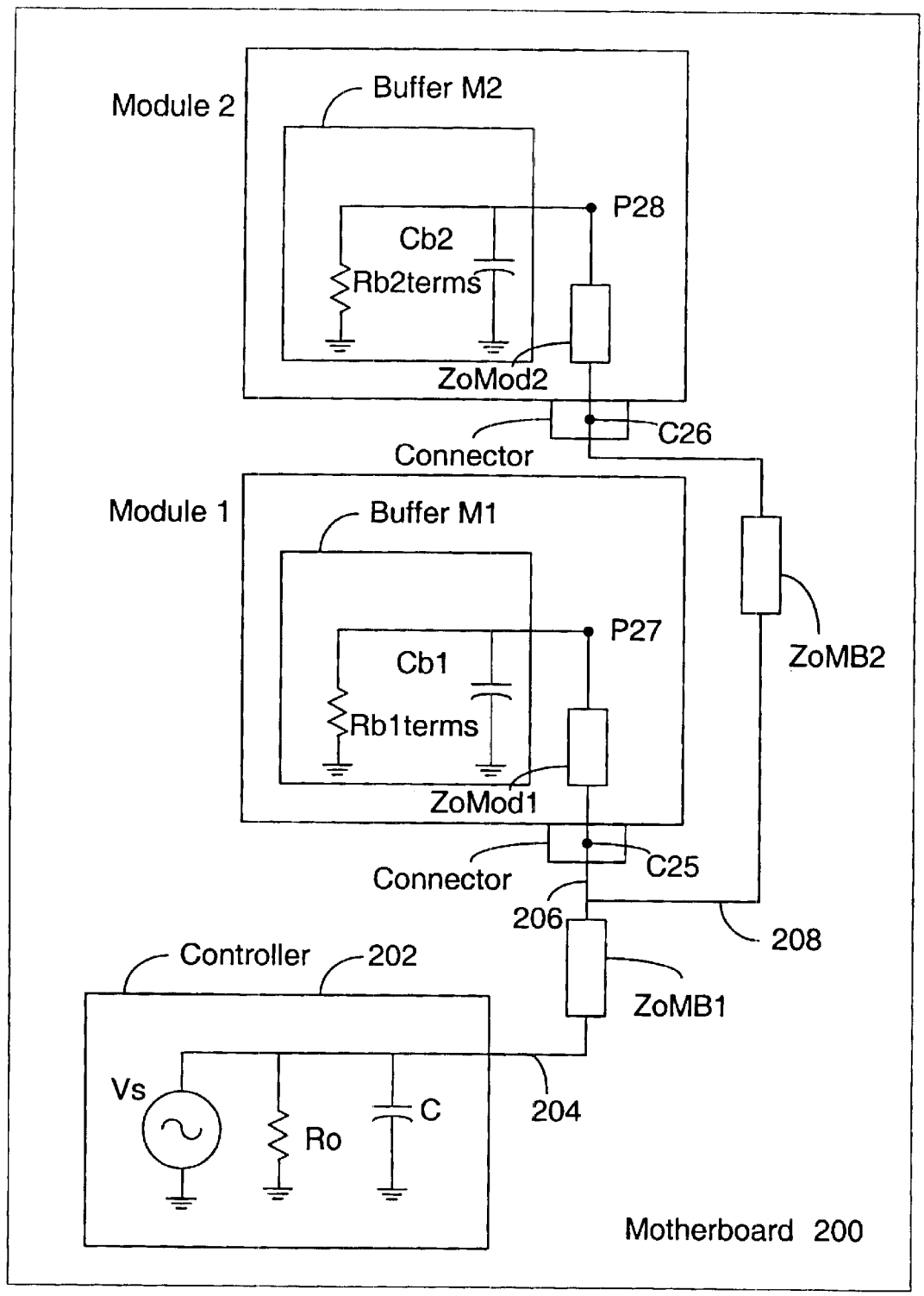
FIG. 19 is a schematic representation of on die terminations in the buffers of FIG. 18.
Figure 20:
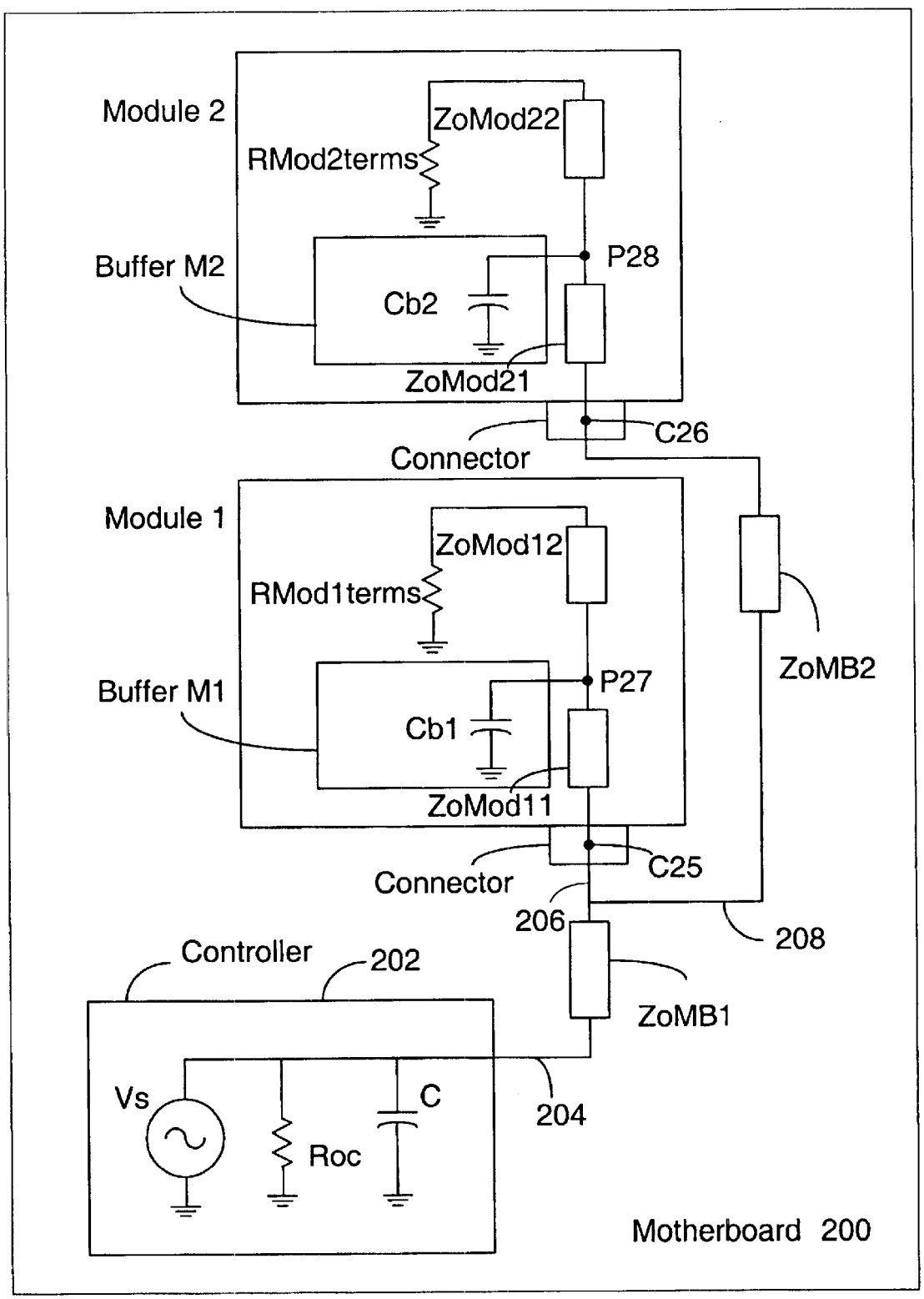
FIG. 20 is schematic representation of off die terminations for the buffers of FIG. 18.

In FIGS. 18–20, C25 and C26 represent multiple connector connections, and P27 and P28 represent multiple package connections. Conductors 204 represent multiple conductors with ZoMB1 representing corresponding impedances. Conductors 208 represent multiple conductors with ZoMB2 representing corresponding impedances. There are multiple conductors between C25 and P27 with corresponding impedances ZMod1, and there are multiple conductors between C26 and P28 with corresponding impedances ZMod2. There are multiple Cb1s and Rb1terms in buffer M1 and multiple Cb2s and Rb2terms in buffer M2. Controller 202 is not restricted to the details shown in FIGS. 19 and 20. In FIGS. 19 and 20, signal regeneration for distribution to I1 –I8 and ECC, etc. is not shown.

FIG. 19 shows an example of how the path (204 and 206) between controller 202 and buffer M1 can be terminated on the die of buffer M1, and how the path (204 and 208) between controller 202 and buffer M2 can be terminated on the die of buffer M2. More particularly, buffer M1 includes termination resistors Rb1terms and buffer M2 includes termination resistors Rb2terms. Because of the split to 206 and 208, it may be desirable that the impedances ZoMB2 are twice the impedances ZoMB1. It may be desirable that the impedances ZoMod1 are twice the impedances ZoMB1, and the impedances ZoMod2 are twice the impedances ZoMB1. It may be desirable that the effective impedances of Cb1 and Rb1 term are twice the impedances ZoMB1, and the impedances Cb2 and Rb2term are twice the impedances ZoMB1. However, in practice these goals might not be practical because of size or other cost constraints. Therefore, ZoMB2, ZoMod1, ZoMod2, and the effective impedances of Cb1 and Rb1term and the effective impedances Cb2 and Rb2term might be, merely as an example, less than twice ZoMB1. For example, ZoMB1 merely as an example, might be 39 ohms and the other impedance values might be 63 ohms. Of course, the inventions are not restricted to these impedance values and other values might be used such as 30 and 60 ohms, 33 and 63 ohms, and 50 and 100 ohms, to mention only some of the possibilities. The impedances other than ZoMB1 and ZoMB2 do not have to equal each other. For example, the impedances for Rb1terms do not have to equal that of ZoMod1.

FIG. 20 shows an example of how the path (204 and 206) between controller 202 and buffer M1 can be terminated off the die of buffer M1, but on module 1, and how the path (204 and 208) between controller 202 and buffer M2 can be terminated off the die of buffer M2, but on module 2. More particularly, buffer M1 includes a capacitive load Cb1 and buffer M2 includes a capacitive load Cb2. Module 1 includes conductor impedances ZoMod11 and ZoMod12 and termination resistors Rmod1term. Module 2 includes conductor impedances ZoMod21 and ZoMod22 and termination resistors Rmod2term. It may be desirable that the impedances ZoMB2 are twice the impedances ZoMB1 (because of the split to 206 and 208). It may be desirable that the effective impedances of Cb1, ZoMod11 and ZoMod12 be twice the impedances ZoMB1, and resistances of RM1term be twice ohms of the impedances ZoMB1. It may be desirable that the effective impedances of Cb2, ZoMod21 and ZoMod22 be twice the impedances ZoMB1, and resistances of RM2terms be twice the ohms of the impedances ZoMB1. The loads Cb1 and Cb2 may not be significant so that ZoMod11, ZoMod12, ZoMod21, and ZoMod22 may be close to the same as RMod1terms and RMod2terms. However, in practice these goals might not be practical because of size or other cost constraints. Therefore ZoMB2, Rmod1terms, Rmod2terms, and the effective impedances Cb1, ZoMod11 and ZoMod12 and effective impedances of Cb2, ZoMod21 and ZoMod22 might be, merely as an example, less than twice ZoMB1. For example, ZoMB1 merely as an example, might be 39 ohms and the other values might be 63 ohms. Of course, the inventions are not restricted to these impedance values and other values might be used such as 30 and 60 ohms, 33 and 63 ohms, and 50 and 100 ohms to mentioned only some of the possibilities. The impedances other than ZoMB1 and ZoMB2 do not have to equal each other. For example, the impedances ZoMod11, ZoMod12, ZoMod21, and ZoMod22 may be different than RMod1terms and RMod2terms.

The above described schemes (e.g., 39 ohms for ZoMB1 and others being 63 ohms) may have two advantages. First, it reduces impedance mismatch. Second, the higher impedance values can be higher or lower depending on physical layer PCB routing feasibility. An advantage of having the termination on the module external to the die is termination does not have to be added to the die thereby reducing the silicon thermal junction temperature risk. This is at the expense of some signal integrity reduction in comparison to on die termination.

In some embodiments of FIGS. 18–20, a p-channel push current mode driver may be used in controller 202 and elsewhere, although the inventions are not so limited. For example, such a driver may include a node at which the conductors 204 meet the controller 202. A p-channel field effect transistor (pFET) has a signal (such as a data signal D#) couple to its gate. The pFET is coupled between the node and a current source. The current source is coupled between the pFET and a power supply for controller 202. An Ro between the node and ground may be greater than 5 times the impedances of conductors 204. However, this ratio may be lowered to improve the matching at the expense of voltage swing for the equivalent driver current. An advantage of this I/O type is primarily the ability to decouple the receiver voltage supply from the driver voltage supply. Other advantages are its high speed capability and its ability for the Ro to be high or low in comparison to the impedance of the path of conductors 202. Of course, the inventions are not limited to these details.

4. Clocking

Figure 21:
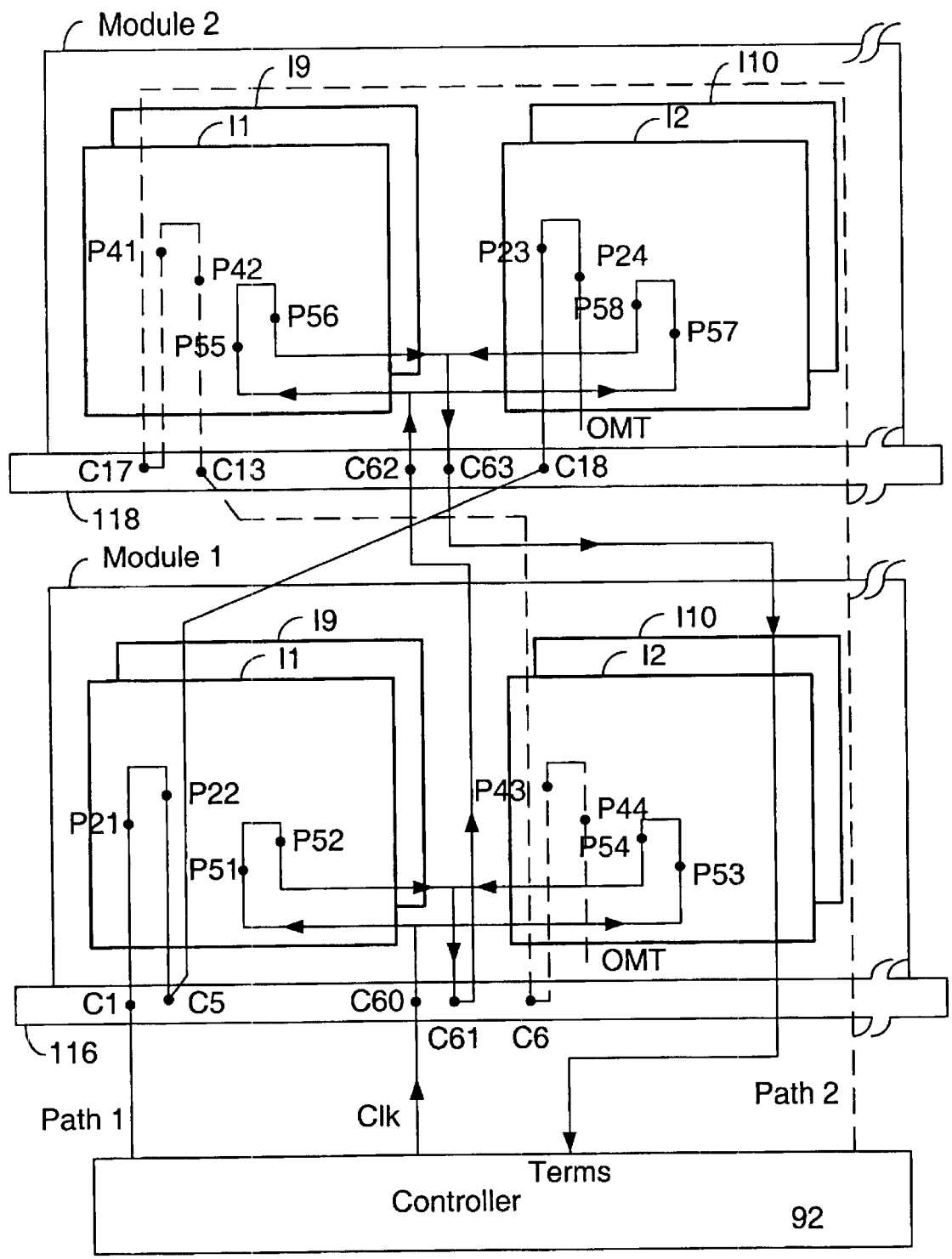
FIG. 21 is a schematic representation of the system of FIG. 14 including a clocking path.
Figure 22:
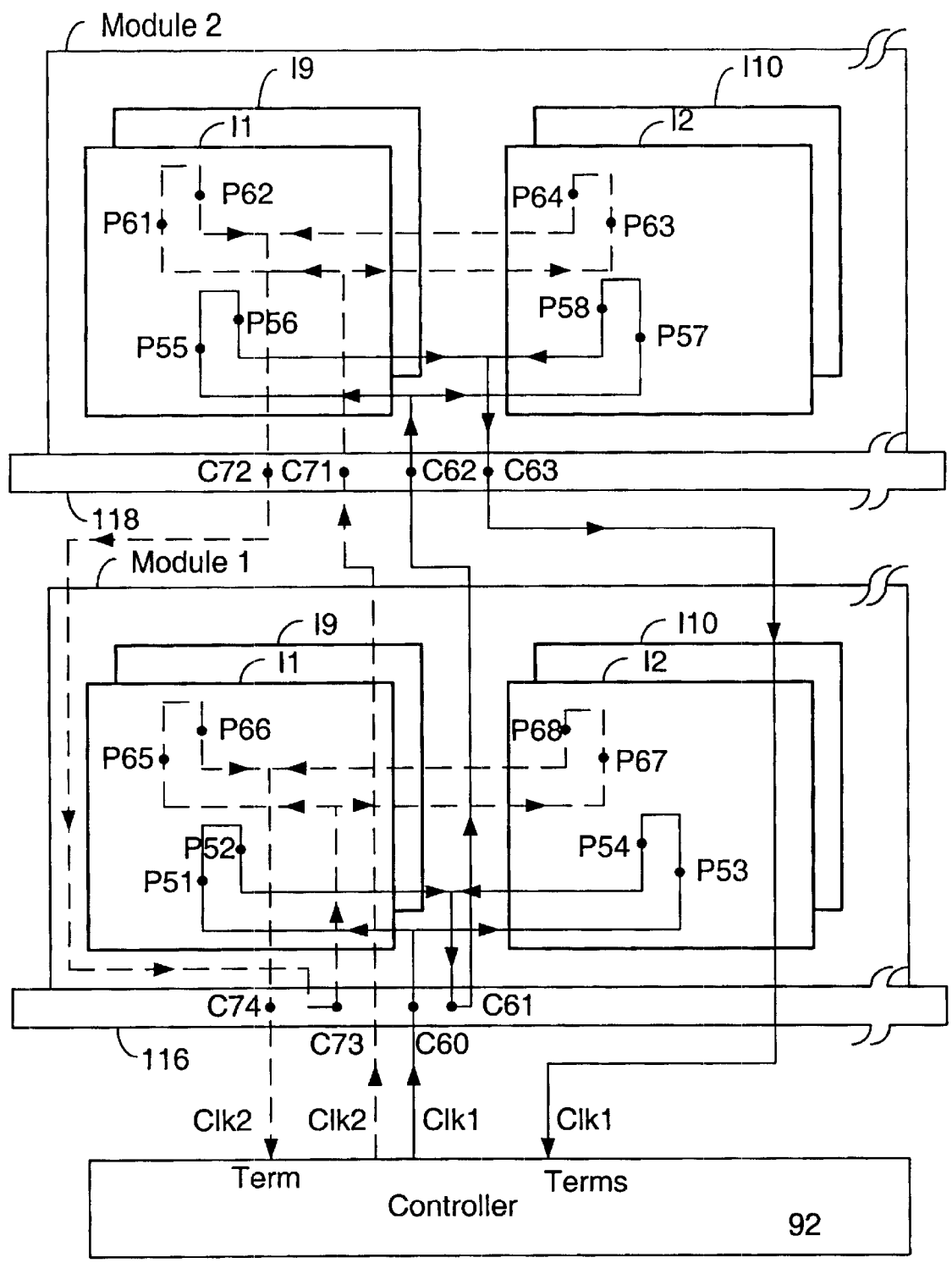
FIG. 22 is a schematic representation of the system of FIG. 21 including an additional clocking path.

FIGS. 21 and 22 illustrate a clocking system that may be used in some embodiments of the inventions. The inventions are not, however, restricted to the details of the clocking schemes of FIGS. 21 and 22. Portions of modules 1 and 2 of FIG. 14 are used for purposes of illustration.

Referring to FIG. 21, clocking for chips I1, I9, I2, and I10 in modules 1 and 2 are shown. Similar clocking can be duplicated for the other chips in modules 1 and 2. Data paths 1 and 2 are shown as in FIG. 14 to provide a context. Path 1 is coupled to package connections P21, P22, P23, and P24. Path 2 is coupled to package connections P41, P42, P43, and P44. A clock signal Clk is provided by controller 92 on a path to chips I1, I9, I2, and I10 in modules 1 and 2. The clocking path includes connector connections C60 and then splits to go to package connections P51 of chip I1 and P52 of chip I9 and to package connections P53 of chip I2 and P54 of chip I10 of module 1. The split clock path merges and proceeds to connector connections C61 of connector 116 and travels to connector connections C62 of connector 118. The clocking path then splits to go to package connections P55 of chip I1 and P56 of chip I9 and to package connections P57 of chip I2 and P58 of chip I10 of module 2. The split clock path merges and proceeds to connector connections C63 of connector 118 and travels to controller 92, wherein it may terminate.

The clock signal may be differential and therefore there may be two conductors and corresponding connections in the clock path. A low or full voltage swing clock may be used.

The clock signal of FIG. 21 provides timing for the data signals on paths 1 and 2. Through this technique, a single clock signal can be used for eight chips. It may be preferred, however, to have one clock signal for reading through path 1 and writing through path 2 and another clock signal for reading through path 2 and writing through path 1. FIG. 22 provides such a system. In FIG. 22, clock signal Clk1 is the same as clock Clk in FIG. 21. Paths 1 and 2 are not shown to avoid clutter in the drawings, but paths 1 and 2 in the system of FIG. 22 may be the same as in FIG. 21. FIG. 22 also adds another clock path to carry a clock signal Clk2, which is provided by controller 92 on a path to chips I1, I9, I2, and I10 in modules 1 and 2. The clocking path for Clk2 includes connector connections C71 of connector 118 and then splits to go to package connections P61 of chip I1 and P60 of chip I9 and to package connections P63 of chip I2 and P64 of chip I10 of module 2. The split clock path merges and proceeds to connector connections C72 of connector 118 and travels to connector connections C73 of connector 116. The clocking path for Clk2 then splits to go to package connections P65 of chip I1 and P66 of chip I9 and to package connections P67 of chip I2 and P68 of chip I10 of module 2. The split clock path merges and proceeds to connector connections C74 of connector 116 and travels to controller 92, wherein it may terminated.

In FIG. 22, data is written through path 1 synchronously with Clk1 and read through path 1 synchronously with Clk2. Data is written through path 2 synchronously with Clk1 and read through path 2 synchronously with Clk1. Accordingly, reading and writing for eight chips can occur with only two clock signals (which may each be differential signals).

It may be desirable if the impedances of the clocking and data paths are matched such that clocking and data signals have close to the same switching speed through these paths. The impedances can be increased (e.g. 25 to 50 ohms or 40 to 60 ohms or some other values) with the splits and return to the original value when the paths merge. As mentioned, the data paths of FIG. 17 may also have stepped increases in impedance with loaded sections near the chip loads having even higher impedance. There may be a further higher impedance of for example 65 ohms (in the 25 to 50 ohms case) for sections that correspond to the loaded sections in the data paths to match the data paths. That is, the clock paths including sections that correspond to the loaded sections of data paths and have corresponding increases in impedances in the sections corresponding to the loaded sections to obtain good matching. As mentioned, although doubling impedances may be desirable for one standpoint, it may not always be practical from an overall system viewpoint and other impedance values may be used.

5. Multiple Module Systems

The following discussion and figures describes and shows systems with two sets of modules on different paths. These systems have particular application to the server environment, but are not restricted to this environment. As illustrated, there are two modules per set. However, there could be three modules or more per set and/or more than two sets.

Figure 23:
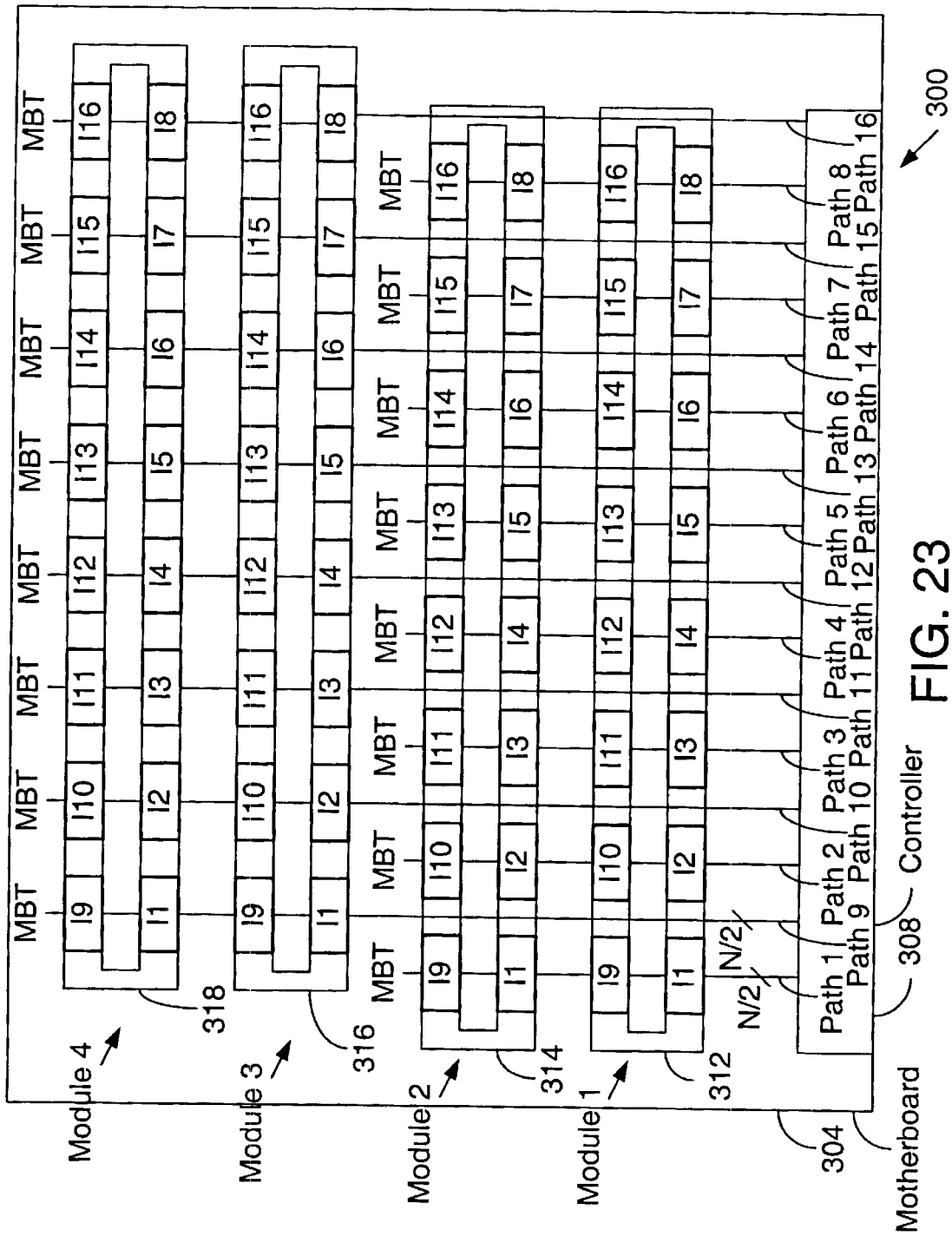
FIG. 23 is a schematic plan representation of a system including a motherboard, a controller, connectors and modules inserted therein.

Referring to FIG. 23, a system 300 includes a motherboard 304 which supports four modules connectors 312, 314, 316, and 318 into which modules 1, 2, 3, and 4 are inserted. Modules 1 and 2 are in one set and modules 3 and 4 are in another set. Paths 1, 2, . . . 8 (which may be bi-directional data paths) are provided to modules 1 and 2 as shown and terminate on motherboard 304 (motherboard terminations (MBT)). For example, path P1 travels between controller 308 and a MBT by way of chips I1 and I9 in module 1 and chips I1 and I9 in module 2. Path 1 may do a short loop through in module 1 between chips I1 and I9 in a manner similar to shown in FIGS. 15 and 26, so as to provide the signals on path 1 to package connections of chips I1 and I9. Likewise, path 1 may do a short loop through in module 2 between chips I1 and I9 in the same manner and then terminate outside module 2 in a termination package or other termination resistors supported by motherboard 334. Paths 2, 3 . . . 8 may also have a similar short loop through arrangement in modules 1 and 2.

Paths 9, 10 . . . 16 are provided to modules 3 and 4 as shown and terminate with MBT. Paths 9, 10 . . . 16 may also have a short loop through arrangement in modules 3 and 4 similar to that of FIGS. 15 and 26.

In the illustrated embodiment, chips I1–I16 are designed to receive N/2 data bits and paths P1–P16 each have N/2 lines. For example, if in the system of FIG. 14, N is eight, then N/2 may be four in the system of FIG. 23. In that case, the systems of FIGS. 14 and 23 would have the same number of data lines (16×4=8×8). (ECC chips may add additional lines.) However, the N in FIG. 23 does not have to be the same as the N in FIG. 14, and N/2 does not have to be four. The paths of FIG. 23 do not have to have N/2 lines.

Figure 24:
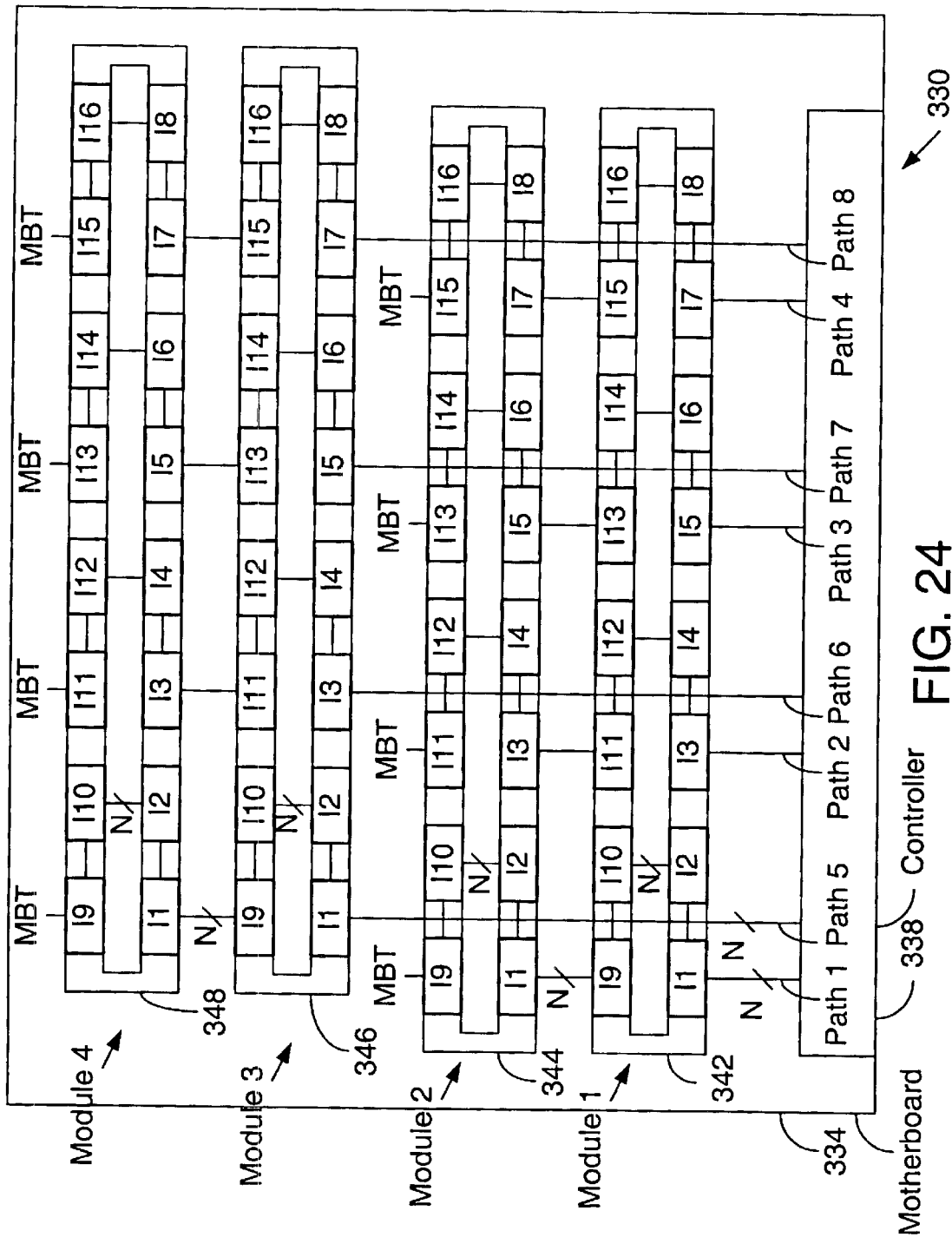
FIG. 24 is a schematic plan representation of a system including a motherboard, a controller, connectors and modules inserted therein.

Referring to FIG. 24, a system 330 includes a motherboard 334 which supports four modules connectors 342, 344, 346, and 348 into which modules 1, 2, 3, and 4 are inserted. Modules 1 and 2 are in one set and modules 3 and 4 are in another set. Paths P1, P2, . . . P4 (which may be bi-directional data paths) are provided to modules 1 and 2 as shown and terminate on motherboard 334 (MBT). Paths P5, P6, . . . P8 (which may be bi-directional data paths) are provided to modules 3 and 4 as shown and terminate on motherboard 334 (MBT). The paths may terminated on the module or on die, but that may require one of the modules to be different than the other(s) or to have a selectable terminations on die or on the module (described below).

Figure 25:
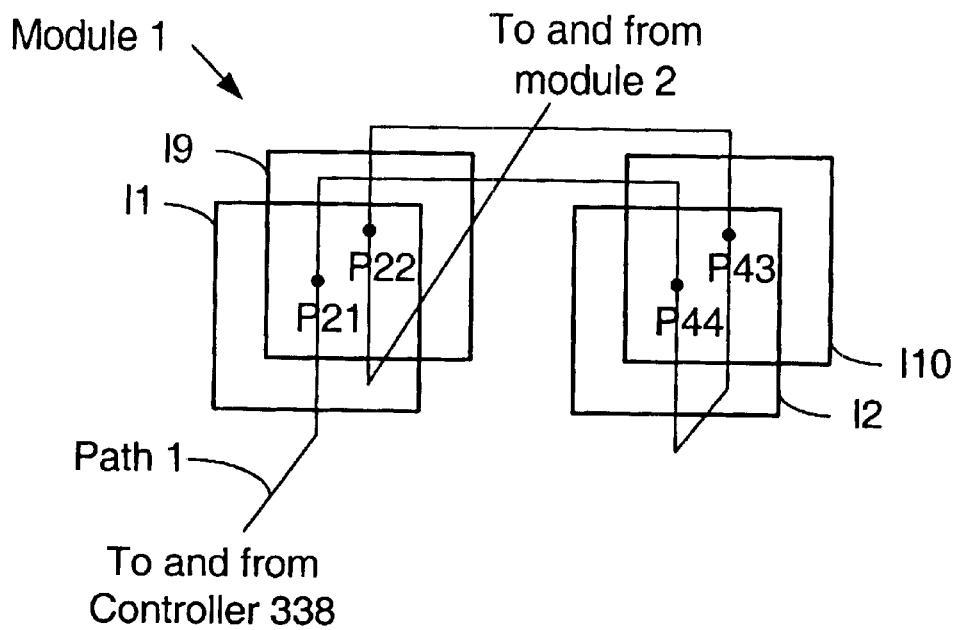
FIG. 25 is a schematic representation of a routing path of the system of FIG. 24.

In the illustrated embodiment of FIG. 24, chips I1–I16 are designed to received N data bits and paths 1–8 each have N lines, which is twice as many as the paths of FIG. 23. However, since there are also one half the number of paths in FIG. 24 as in FIG. 23, the number of lines in FIG. 23 is the same as in FIG. 24 (N×8=N/2×16) as in FIG. 23. In FIG. 24, the paths provide data to four chips. For example, path 1 provides data to chips I1, I2, I10, and I9. There are many ways in which this can be done. FIG. 25 illustrates one way. Referring to FIG. 25, path 1 passes adjacent to chip I1 and is coupled to a package connections P21 of chip I1, either directly or through a via. Path 1 extends to chip I2 of module 1, where it is coupled to package connections P44, and so forth with path 1 coupling to package connections P43 of chip I10 and P22 of chip I9 in module 1. The path does not have to have this particular layout. For example, it does not have to extend above the chips or extend in straight lines or at 90 degree angles.

The routing of FIG. 25 can be compared to that of FIG. 26. FIG. 26 illustrates a portion of the routing of paths 1 and 2 in module 1. Path 1 in module 1 includes a short loop through section to couple to package connections P21 and P22.

The ECC, buffering, clocking schemes, short term card, and selectable on die or on module terminations described herein may be used in connection with the systems 300 and 330 and other systems described herein. Systems 300 and 330 are not restricted to using only two modules per path, but could use three or more.

6. Termination Card (Dummy Module)

Figure 27:
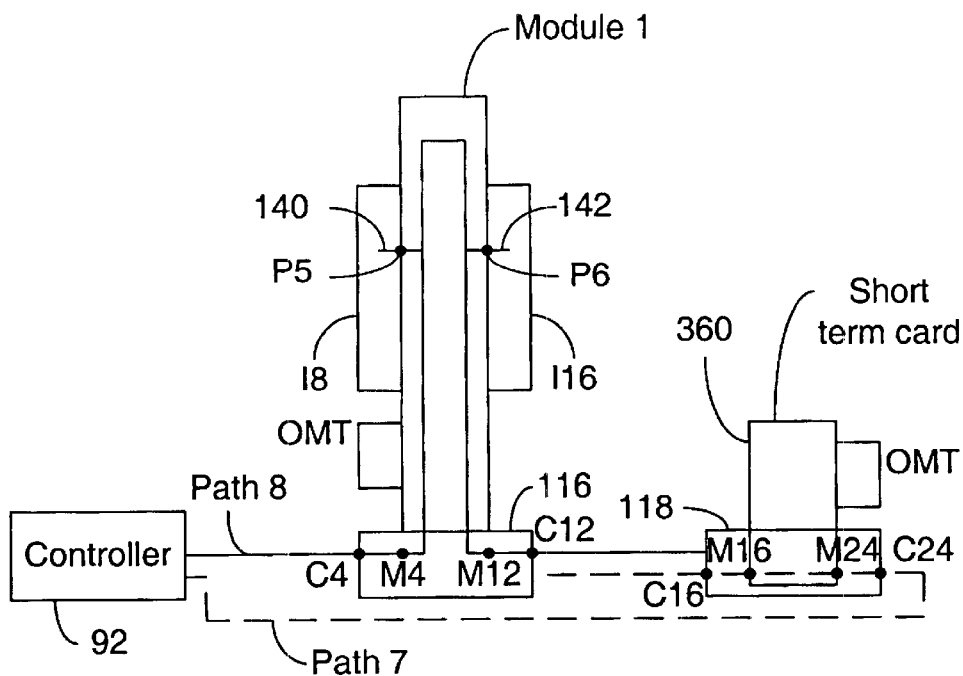
FIG. 27 is a schematic cross sectional side view representation of module 1 of FIG. 14 in which a short term card is used in place of module 2.

The system of FIG. 14 may be used with two modules or with a module and termination card, which is an example of a dummy module. A dummy module includes a circuit board (substrate), without the chips of an active module, that is used in place of the active module. A reason to have a dummy module is because it is less expensive than the module, but it completes the circuit as does the module. Referring to FIG. 27, an example of a termination card is short termination card 360 which in the illustrated embodiment fits into slot 18 of system 100 (see FIGS. 14 and 15). Short termination card 360 is referred to as short because it is not as tall as the modules 1 and 2. Short termination card 360 is designed to pass or terminate signals from the paths or other signals (e.g., ECC, buffering, clocking schemes or other features mentioned in this disclosures) that may be present just as if it were module 2.

Figure 28:
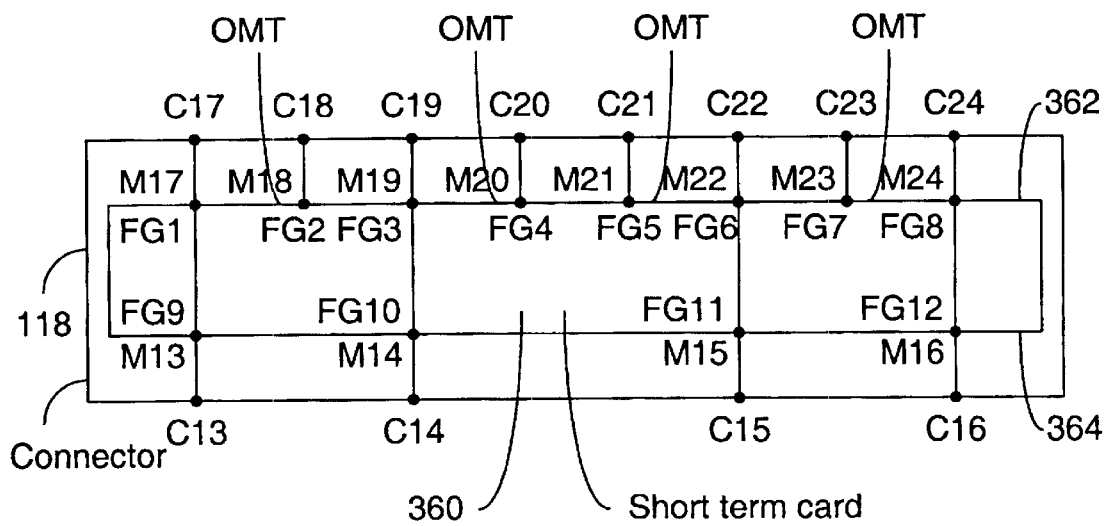
FIG. 28 is a schematic plan representation of the short term card of FIG. 27.

FIG. 28 illustrates a schematic plan view of short term card 360 having first and second sides 362 and 364 connected to connector 118. First side 362 includes finger groups FG1, FG2 . . . FG8. Second side 364 includes finger groups FG9, FG10, FG11, and FG12. In either FIG. 27 or FIG. 28, there may be additional finger groups if needed (for example, in the case in which there are additional paths or if the module with chips include ECC chips or a buffer).

As can be seen through comparing FIG. 28 with module 2 in FIG. 14, in those paths for which there are no on module terminations, short termination card 360 fills the gap between connector contacts (e.g., between M16 and M24 and FG1 and FG9). In the case in which an OMT is involved, it is not necessary to pass conductors through the module. Rather, a module could be on the same side as the path is received. For example, in FIG. 14, in module 2, conductors of path 1 pass between M18 and the other side of the module to couple to an OMT. Short termination card 360 could have a similar routing with the OMT on the same side as that of module 2 (as shown in FIG. 27), or it could have the OMT on the same side as M18 and not have to pass conductors across the module.

FIG. 27 shows possible locations of OMTs on module 1 and short term card 360, although the inventions are not restricted to these locations. Any suitable locations on the module is acceptable for the OMTs. Note that in the case of module 1, the OMT is for a path other than path 8. In the case of short term card 360 and module 1, only one of the OMTs is shown.

Figure 29:
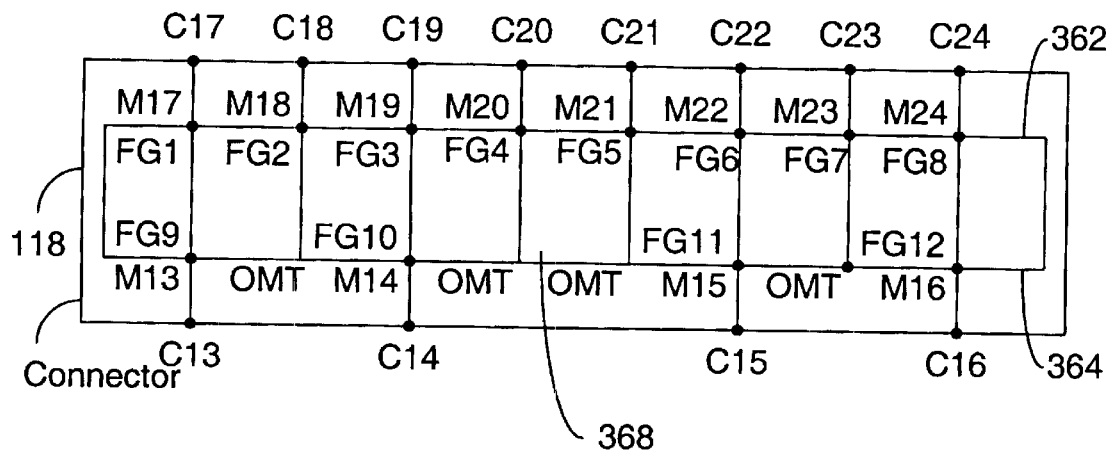
FIG. 29 is an alternative to FIG. 28.

FIG. 29 shows an alternative short term card 368 in which the OMTs are on the second side 364 coupled to finger groups FG2, FG4, FG5 and FG7 by conductors.

In some embodiments, some OMTs could be on side 362 and other OMTs could be on side 364. This could be with a routing like that shown in FIGS. 14, 28, and 29, or with a different routing in which some of the OMTs on the module where on one side and some on the other.

7. Short Stub Created from a Path Loop in the Module and Selectable on Die Terminations FIGS. 30–34 illustrate two independent aspects of the inventions (1) a short stub created from a path loop in the module and (2) selectable on die terminations. These aspects are presented together, but they may be used independently.

Note that in FIGS. 14 and 15, path 8 loops between package connections P5 and P6. By contrast, in FIG. 30, path 8 in a system 380 extends only partly into module 1 and couples to a short stub 386 which in turn couples to package connections P5 and P6 either directly or through a via. Path 8 has no loop in module 2 but rather extends all the way to package connections P 11 and P12 (or to a via that connects to P11 and P12). FIG. 31 shows a route for path 7 in which a short loop in module 2 connects to a short stub 388 and no loop is in module 1. The loop in paths 7 and 8 can be longer or shorter than shown (note that in FIG. 31, the loop in path 7 is shorter than that of path 8 in FIG. 30).

Figure 30:
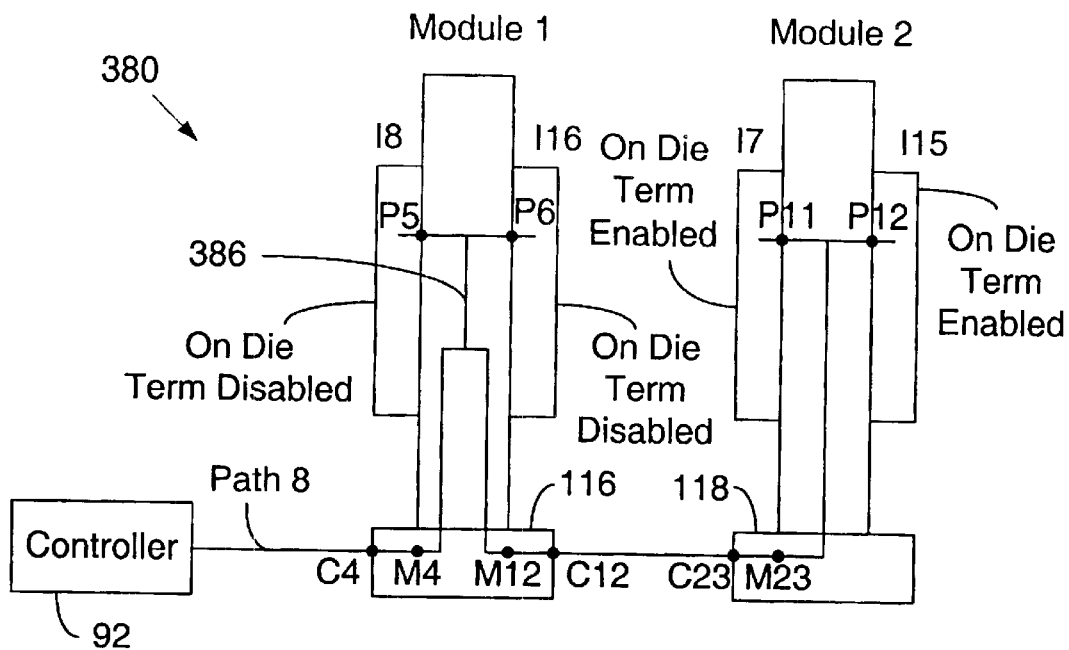
FIG. 30 is a schematic cross sectional side view representation of an alternative embodiment for the system of FIG. 14.
Figure 31:
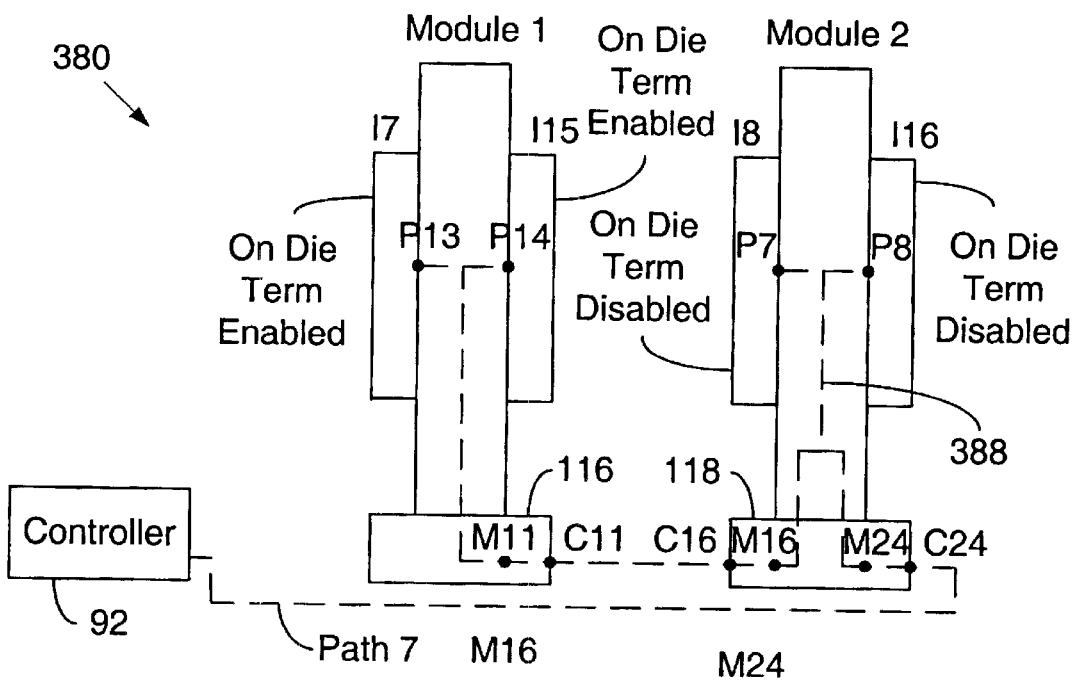
FIG. 31 is a schematic cross sectional side view representation of an alternative embodiment for the system of FIG. 14.

In a separate invention, in FIGS. 30 and 31, modules 1 and 2 each have selectable on die terminations. In the example of FIGS. 30 and 31, the on die terminations are disabled in chips 18 and 116 of module 1 and chips 18 and 116 of module 2. The on die terminations are enabled in chips 17 and 115 of module 1 and 17 and 115 of module 2. The chips with the enabled on die terminations may be the same as those in the module with OMT in FIG. 14. Accordingly, for some paths, module 1 will have enabled on die terminations and module 2 will have disabled on die terminations. For other paths, module 1 will have disabled on die terminations and module 2 will have enabled on die terminations.

Figure 32:
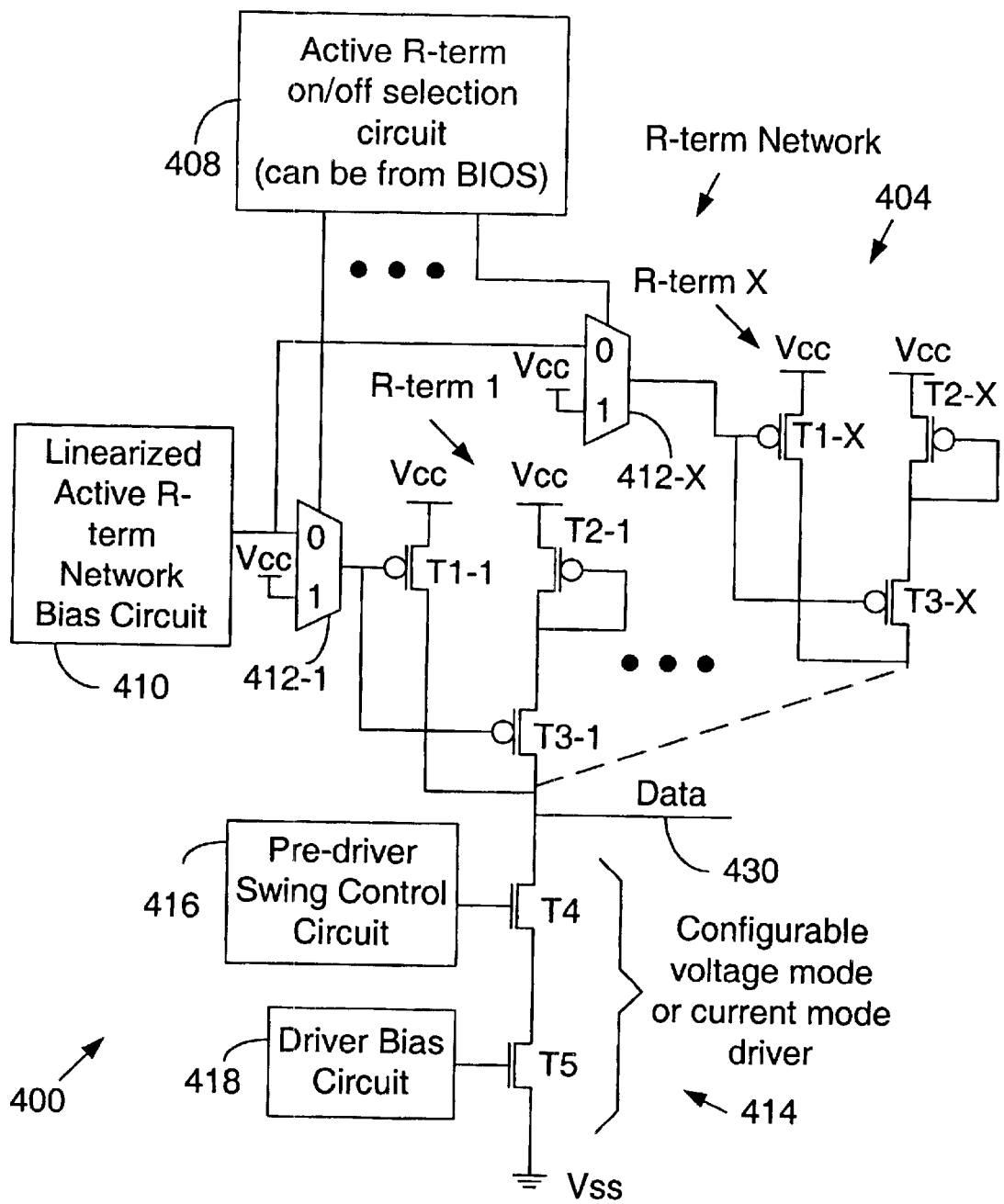
FIG. 32 is a schematic representation of a selectively enabled on die termination circuit that may be used in the systems of FIGS. 30, 31 and 34.
Figure 33:
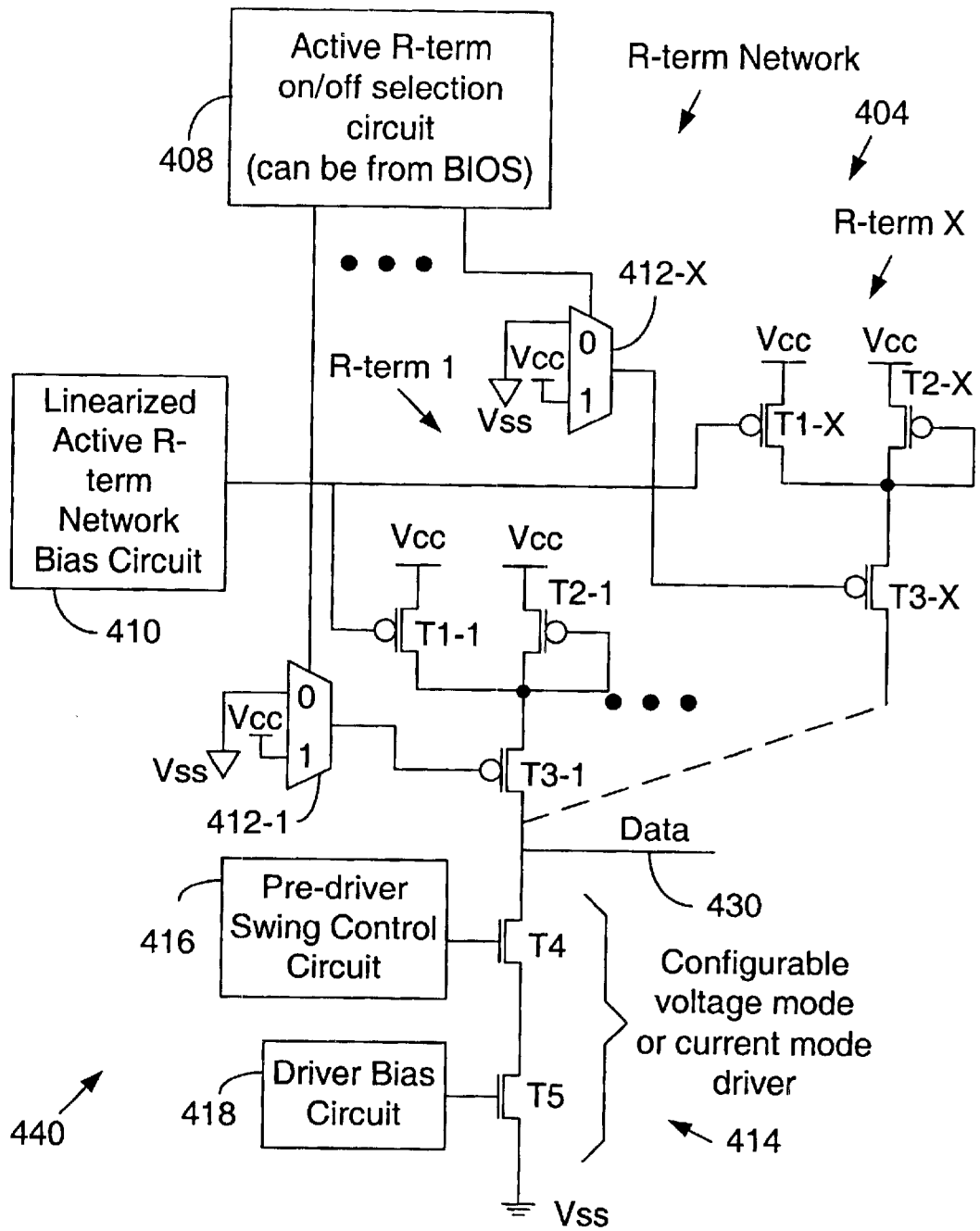
FIG. 33 is a schematic representation of a selectively enabled on die termination circuit which is an alternative to that of FIG. 32 and may be used in the systems of FIGS. 30, 31 and 34.
Figure 34:
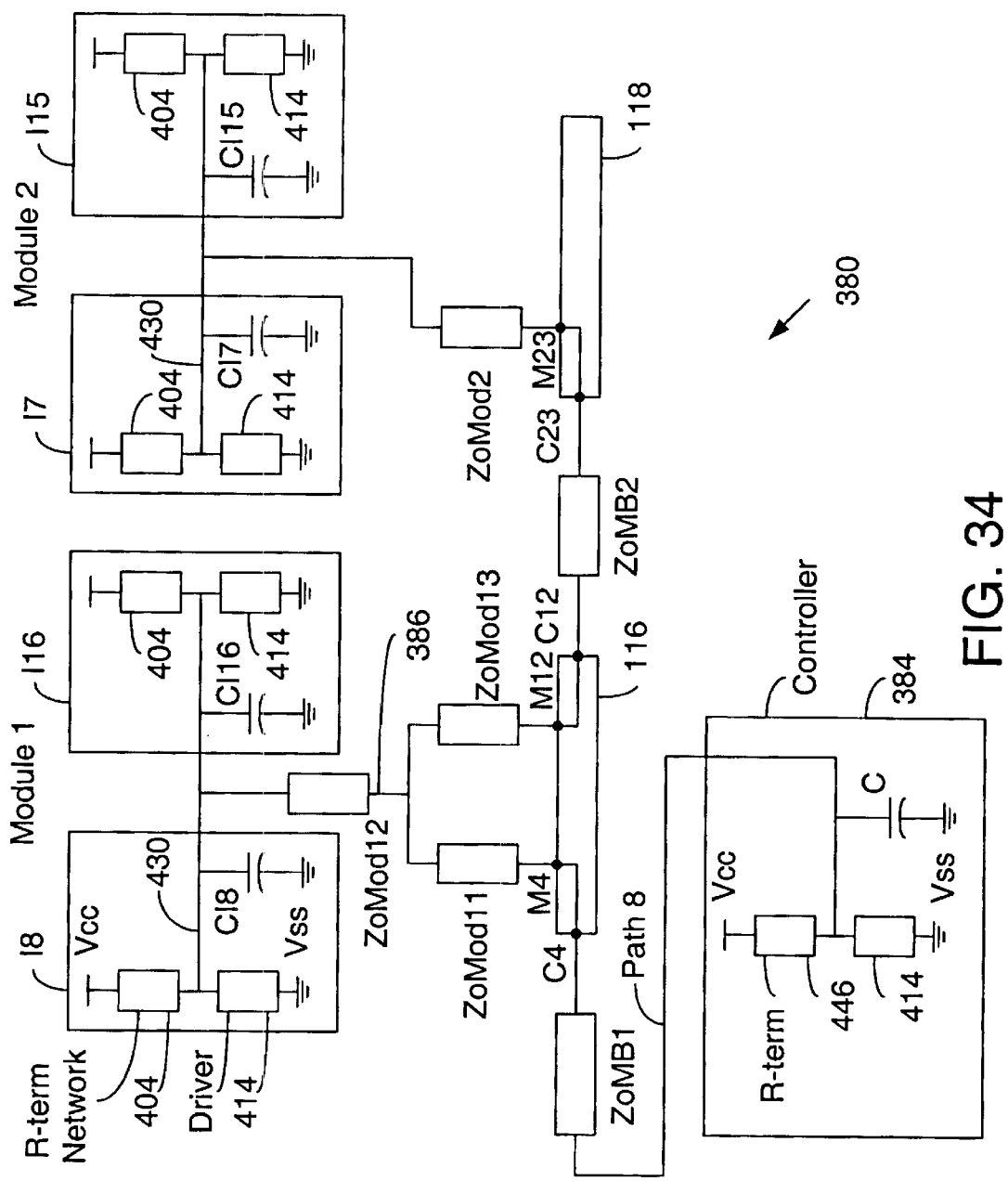
FIG. 34 is a schematic representation of a system employing a layout of FIG. 30.

A circuit 400 in FIG. 32 is one example and a circuit 440 in FIG. 33 are examples of circuits that can be used selectively enable or disable on die terminations. Various other circuits could be used and the inventions are not restricted to these details of circuits 400 and 440. For example, the R-termination elements could be pull down rather than pull up. Circuits 400 and 440 include an R-termination network 404 which are illustrated in FIG. 34. Referring to FIG. 32, R-termination network 404 includes X number of R-termination elements R-term 1, . . . R-term X. Depending on the implementation, X may be as low as less than 5 to more than 100. Each element includes transistors T1, T2, and T3. The R-term elements are controlled by an active R-term on/off selection circuit 408 through multiplexers 412-1 . . . 412-X and a linearized active R-term network bias circuit 410. In the illustrated circuit 400, the "1" value of multiplexers 412-1 . . . 412-X is tied to Vcc (but it may be provided by bias circuit 410). The "0" value of multiplexers 412-1 . . . 412-X is provided by bias circuit 410 (but it may be tied to ground). That is, in the illustrated circuit 400, the "0" value might not be at ground to control how much transistors T1 and T2 are turned on. Some feedback could be used to compensate for temperature, process variations etc. Configurable driver 414 includes pre-driver swing control circuit 416 and driver bias circuit 418. In FIG. 32, network 404 is between power and data node 430 and driver 414 is between data node 430 and ground. That is, the termination is to the power supply voltage node. Alternatively, network 404 could be between node 430 and ground and driver 414 could be between the power supply node and ground. Note that the system can have only one or more than one power supply and ground voltage values.

In FIG. 34, system 380 includes a controller 384 which is coupled to modules 1 and 2. Modules 1 and 2 and connectors 116 and 118 are similar to those in FIG. 15, except that the chips include selectable on-die terminations instead of OMTs. Path 8 is illustrated. In FIG. 34, in module 1, chips I8 and I16 have on die terminations disabled and in module 2, chips I7 and I15 are on die terminations enable. Accordingly, in each of chips I8 and I16, selection circuit 408 select each of multiplexers 412 to provide the "1" value to turn off each R-term element (R-term 1 . . . R-term X). Drivers 414 may also be turned off. By contrast, in chips I7 and I15, driver 414 is on and selection circuit 408 selects at least one of the R-term elements of R-termination network 404. The number of R-term elements selected and perhaps the "0" value are controlled to give a desired impedance level, described next. There may be one or more than one selection circuit 408 and one or more than one bias circuit 410.

Referring to FIG. 33, circuit 440 is similar to circuit 400 except as shown. For example, network bias circuit 410 controls the gates of FETs T1-1 and T2-1 . . . T1-X and T2-X. Multiplexers 412-1 . . . 412-X have inputs tied to power and ground. The drains of T1-1 and T2-1 . . . T1-X and T2-X are tied together.

Referring to FIG. 34, impedance ZoMB1 represents the impedance on path 8 on the motherboard between controller 384 and connector 116 and impedance ZoMB2 represents the impedance on the motherboard on path 8 between connector 116 and connector 118. Impedances ZoMod11 and ZoMod13 are impedances of path 8 in module 1 and ZoMod12 is the impedance of stub 386 (see FIG. 30). Impedance ZoMod2 is the impedance of path 8 in module 2. It may be desirable if the impedances of ZoMod11, ZoMod12, and ZoMod13 were larger than that of ZoMB1 and ZoMB2. Merely as an example, assume ZoMB1 and ZoMB2 were 39 ohms. The impedance of ZoMod11, ZoMod12, and ZoMod13 might be 63 ohms to, for example, compensate for chip capacitance. Of course, other values (such as those listed above) could be used for tradeoffs with expense, board layout, and performance. It may be desirable if the impedances of the enabled on-die terminations (R-termination networks 404) in chips I7 and I15 were about twice that of ZoMB1 and ZoMB2. For example, if ZoMB1 and ZoMB2 are 39 ohms, then about 78 ohms might be chosen for network 404. Of course, other values might be chosen and the inventions are not restricted to these values. ZoMod2 may be the same as that of ZoMB1 or it could be higher, for example to compensate for chip impedance.

In each of the systems described herein, an attempt can be made to increase impedance gradually or through steps. For example, in FIG. 34, the impedance might increase from ZoMB1 to MoMod11 to ZoMod12 and then decrease from ZoMod12 to ZoMod13 to ZoMB2. The trace sections near the chips may have higher impedance than those trace sections further from the chips.

As illustrated, system 380 is a dual termination system in that controller 384 includes an R-term element 446 and a driver 414. There may be a separate R-term element for each line of path 8. Rather then use a single R-term element for termination, more than one element may be used.

The on-die termination feature is not restricted to use with the short stubbed systems of FIG. 30 and 31. It may be used in connection with systems with short loop through configurations (such as in FIG. 15). In that case, in FIG. 34, the impedances in module 1 would be like those shown in module 1 of FIG. 17. Further, the circuit of FIG. 32 could be employed in connection with terminations in the chip package or on the modules.

8. Single Side Embodiments

Figure 35:
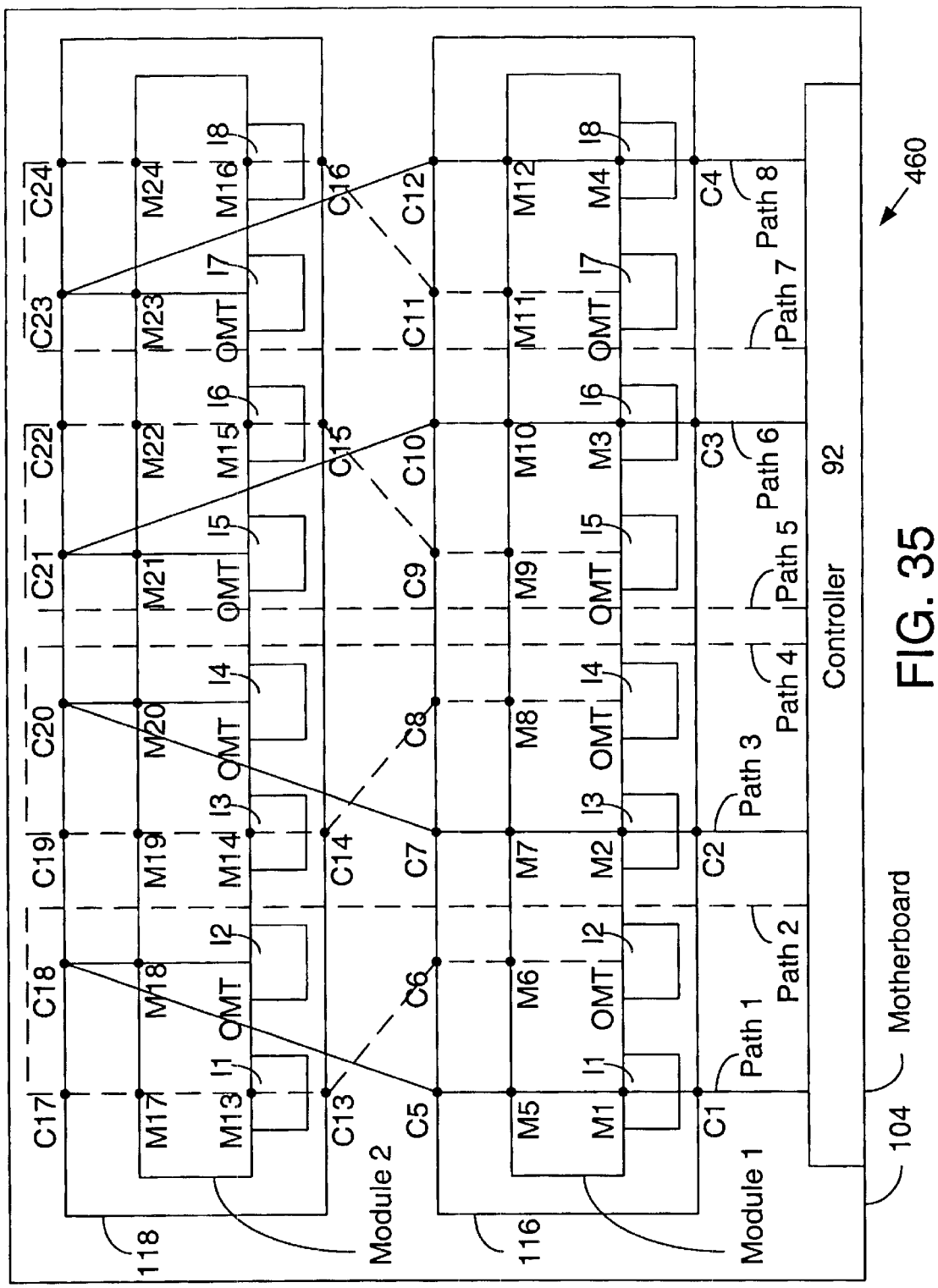
FIG. 35 is a schematic plan view representation of a single sided system similar to the dual sided system of FIG. 14.
Figure 36:
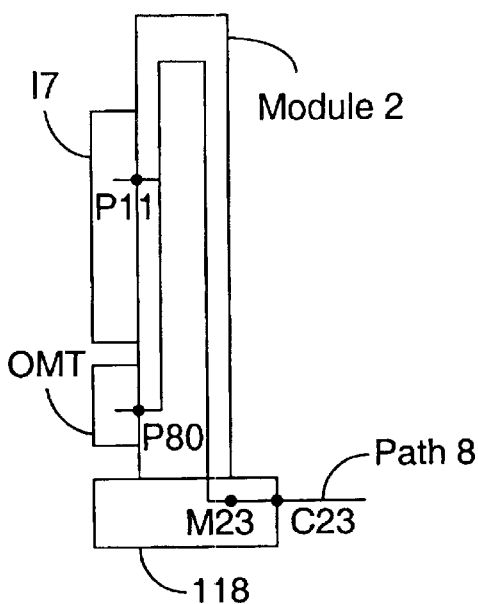
FIG. 36 is a schematic cross sectional side view representation of a single sided module.
Figure 37:
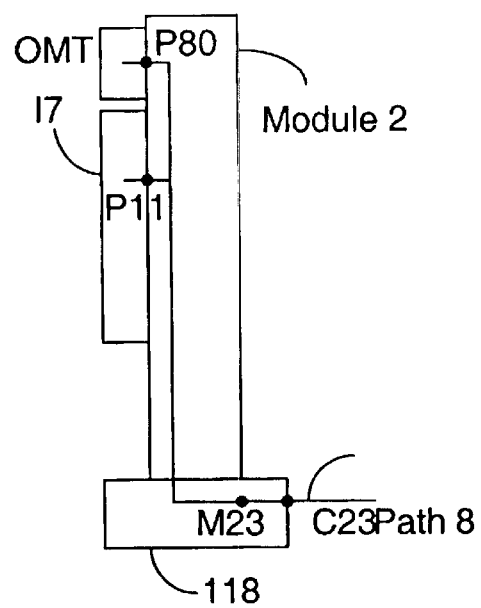
FIG. 37 is a schematic cross sectional side view representation of a single sided module.

FIGS. 11–34 illustrate systems and features thereof for dual sided modules (chips on both sides of the module). The invention, however, is not restricted to use with dual sided modules, but rather could also be used with single side modules. FIG. 35 illustrates routing for a system similar to that of FIG. 14 except that single side modules are used rather than dual sided modules. FIGS. 36 and 37 show to routing paths for path 8 to terminate on an OMT through package connections P80. Various other positions of the OMT could be used. FIG. 35 shows connector contacts being on both sides of the connector module slots (16 and 18). Alternatively, they could all be on the front side of the module slots.

9. Additonal Information and Inventions

Figure 38:
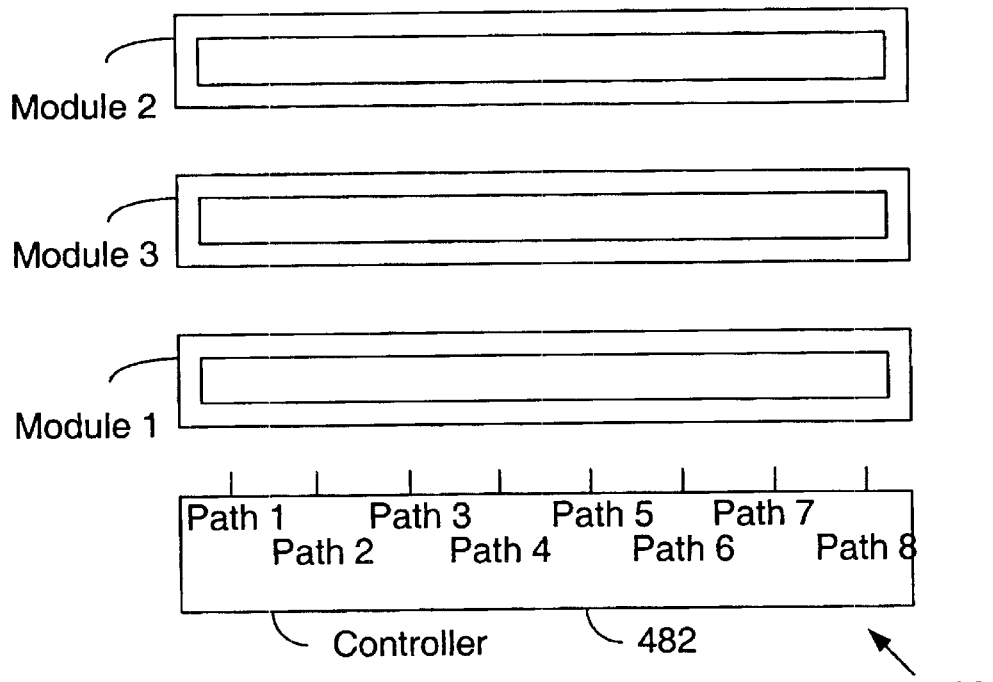
FIG. 38 is a schematic representation of a system having three modules and a controller.

The illustrations described above show only two modules. However, more than two modules per path may be used. For example, FIG. 38 shows a system 480 with a controller 482 which includes modules 1, 2, and 3. Module 3 is a module that from a path point of view acts as a bridge between modules 1 and 2. Accordingly, in any of the FIGS. 1–37, modules 1 and 2 may be the same, with module 3 acting as a bridge between modules 1 and 2. Alternatively, there could be different routings for modules 1 and 2 when there is a module 3.

Figure 39:
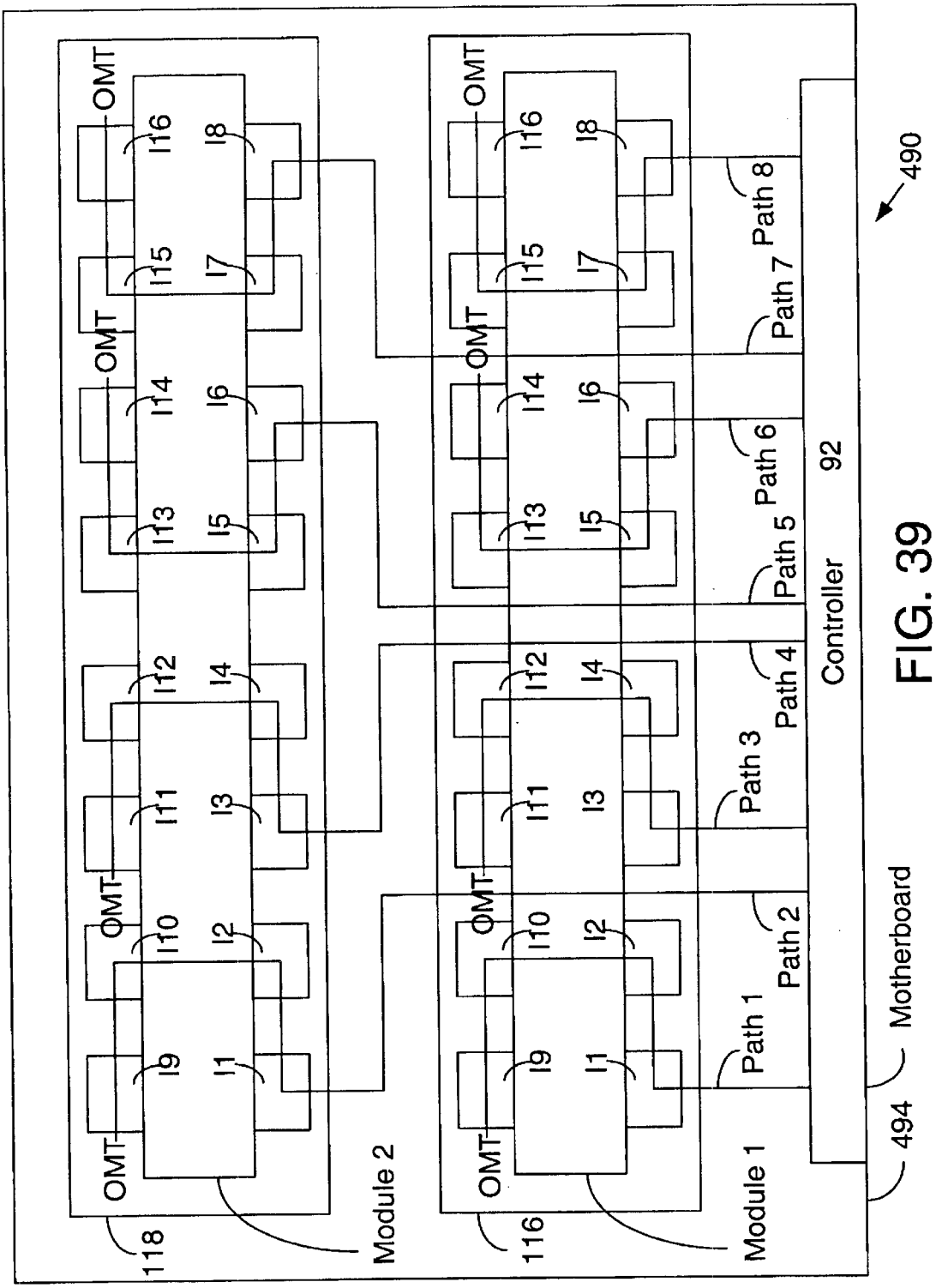
FIG. 39 is a schematic plan view representation of a system including a motherboard, a controller, and two module connectors with modules.

In some embodiments of the inventions, a path does not go to two modules, but stays on only one module and has on module termination on that module. For example, FIG. 39 shows a system 490 which includes a motherboard 494 and paths as shown. The ECC and/or buffer chips may be used in any environment described herein.

The modules may be removable received into the module slots or may be more permanently received by the connectors.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A termination card comprising:
   a substrate having groups of fingers on a first side of the substrate and groups of fingers on a second side of the substrate; and
   wherein some of the groups of fingers on the first side are coupled to some of the groups of fingers on the second side are not coupled to on module terminations, and others of the groups of fingers on the first side are coupled to on module terminations on the first side.

2. The termination card of claim 1, wherein still others of the groups of fingers on the first side are coupled to the second side to other on module terminations.

3. The termination card of claim 1, wherein the on module terminations are in groups that correspond to the others of the groups of fingers on the first side.

4. The termination card of claim 1, wherein the on module terminations are created from resistor elements.

5. A termination card comprising:
   a substrate having groups of fingers on a first side of the substrate and groups of fingers on a second side of the substrate; and
   wherein some of the groups of fingers on the first side are coupled to some of the groups of fingers on the second side and are not coupled to on module terminations, and others of the groups of fingers on the first side are coupled to on module terminations on the second side.

6. The termination card of claim 5, wherein still others of the groups of fingers on the first side are coupled to other on module terminations on the first side.

7. The termination card of claim 5, wherein the on module terminations are in a termination package.

8. A termination card comprising:
   a substrate having groups of fingers on a first side of the substrate and groups of fingers on a second side of the substrate; and
   wherein some of the groups of fingers on the first side and some of the groups of fingers on the second side are connected through module connectors, and at least one other of the groups of fingers on the first side are coupled to at least one group of on module terminations on the first side and at least some of the fingers are not coupled to on module terminations.

9. The termination card of claim 8, wherein still others of the groups of fingers on the first side are coupled to the second side to other on module terminations.

10. A system comprising:
a first module and a termination card;
a circuit board including first and second module connectors to receive the first module and the termination card, respectively;
a first path of conductors extending from the circuit board to the first module connector, to the first module, back to the first module connector, to the circuit board, to the second module connector, to the termination card, and to on module terminations of the termination card; and
a second path of conductors extending from the circuit board to the second module connector, to the termination card, back to the second module connector, to the circuit board, to the first module connector, to the first module, and to on module terminations of the first module.

11. The system of claim 10, wherein the termination card includes:
a substrate having groups of fingers on a first side of the substrate and groups of fingers on a second side of the substrate; and
wherein some of the groups of fingers on the first side are coupled to some of the groups of fingers on the second side and are not coupled to on module terminations, and others of the groups of fingers on the first side are coupled to on module terminations on the first side.

12. The system of claim 11, wherein still others of the groups of fingers on the first side are coupled to the second side to other on module terminations.

13. The system of claim 10, wherein the termination card includes:
a substrate having groups of fingers on a first side of the substrate and groups of fingers on a second side of the substrate; and
wherein some of the groups of fingers on the first side are coupled to some of the groups of fingers on the second side and are not coupled to on module terminations, and some of the groups of fingers on the first side are coupled to on module terminations on the second side.

14. The system of claim 13, wherein still others of the groups of fingers on the first side are coupled to other on module terminations.

15. The system of claim 10, wherein-the first and second module connectors each have front sides and back sides, and the first path extends from the back side of the first module to the back side of the termination card.

16. The system of claim 10, wherein the first and second module connectors each have front sides and back sides, and the first path extends from the back side of the first module to the front side of the termination card.

17. The system of claim 10, wherein the first module and termination card and first and second module connectors are keyed so the first module and the termination card each may be received in only one rotational orientation.

18. The system of claim 10, wherein the first module and termination card are interchangeable so that the first module may be received by the second module connector and the termination card may be received by the first module connector without rotating the orientation of either module.

19. The system of claim 10, further comprising a buffer on the first module, but not on the termination card.

20. The system of claim 10, further comprising error correction code chips on the first module, but not on the termination card.

21. The system of claim 10, further comprising a controller, wherein the first module connector is closer to controller than is the second module connector.

22. The system of claim 10, further comprising a second module.

23. The system of claim 10, wherein the circuit board is a printed circuit board and a motherboard.

24. The system of claim 10, wherein the termination card is shorter than the module.

* * * * *

UNITED STATES PATENT AND TRADEMARK OFFICE
CERTIFICATE OF CORRECTION

PATENT NO. : 6,674,648 B2
DATED : January 6, 2004
INVENTOR(S) : McCall et al.

It is certified that error appears in the above-identified patent and that said Letters Patent is hereby corrected as shown below:

Column 6,
Line 35, delete "12, 14, 15, and 17", insert -- I2, I4, I5, and I7 --.

Column 10,
Line 44, delete "12", insert -- I2 --.
Line 67, delete "P60", insert -- P62 --.

Column 13,
Lines 57-59, delete "chips 18 and 116 of module 1 and chips 18 and 116 of module 2. The on die terminations are enabled in chips 17 and 115 of module 1 and 17 and 115", insert -- chips I8 and I16 of module 1 and chips I8 and I16 of module 2. The on die terminations are enabled in chips I7 and I15 of module 1 and I7 and I15 --.

Signed and Sealed this

Twenty-seventh Day of July, 2004

JON W. DUDAS
*Acting Director of the United States Patent and Trademark Office*